(12) United States Patent
Lee et al.

(10) Patent No.: US 12,408,527 B2
(45) Date of Patent: Sep. 2, 2025

(54) DISPLAY DEVICE AND ELECTRONIC DEVICE INCLUDING THE SAME

(71) Applicant: Samsung Display Co., LTD., Yongin-si (KR)

(72) Inventors: Hyun Dae Lee, Yongin-si (KR); Jung Woo Park, Yongin-si (KR); Hyang A Park, Yongin-si (KR); Il Nam Kim, Yongin-si (KR); Hyoung Wook Jang, Yongin-si (KR); Kang Bin Jo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/817,023

(22) Filed: Aug. 27, 2024

(65) Prior Publication Data

US 2025/0185478 A1    Jun. 5, 2025

(30) Foreign Application Priority Data

Dec. 1, 2023   (KR) .......................... 10-2023-0172387

(51) Int. Cl.
| | |
|---|---|
| *H10K 59/131* | (2023.01) |
| *G06V 40/13* | (2022.01) |
| *G09G 3/3233* | (2016.01) |
| *H01L 25/16* | (2023.01) |
| *H10D 86/40* | (2025.01) |
| *H10D 86/60* | (2025.01) |
| *H10K 59/60* | (2023.01) |

(52) U.S. Cl.
CPC ......... *H10K 59/131* (2023.02); *G09G 3/3233* (2013.01); *H01L 25/167* (2013.01); *H10D 86/441* (2025.01); *H10D 86/60* (2025.01); *H10K 59/60* (2023.02); *G06V 40/1318* (2022.01); *G09G 2300/0426* (2013.01); *G09G 2300/0819* (2013.01); *G09G 2300/0842* (2013.01); *G09G 2300/0861* (2013.01); *G09G 2310/08* (2013.01); *G09G 2360/14* (2013.01)

(58) Field of Classification Search
CPC .... G09G 3/3233; H10K 59/60; H10K 59/131; H10D 86/441; H10D 86/60; H01L 25/167
See application file for complete search history.

(56) References Cited

U.S. PATENT DOCUMENTS

| | | | |
|---|---|---|---|
| 11,158,258 B2 * | 10/2021 | Cha .................. | H10K 77/00 |
| 11,631,271 B2 | 4/2023 | Kim et al. | |
| 11,783,620 B2 | 10/2023 | Lee et al. | |
| 11,862,100 B2 * | 1/2024 | Jo .................... | G09G 3/3241 |
| 11,955,078 B2 * | 4/2024 | Song ................ | G09G 3/3233 |

(Continued)

FOREIGN PATENT DOCUMENTS

| | | |
|---|---|---|
| KR | 10-2448031 B1 | 9/2022 |
| KR | 10-2502201 B1 | 2/2023 |
| WO | 2023/211102 A1 | 11/2023 |

*Primary Examiner* — Sardis F Azongha
(74) *Attorney, Agent, or Firm* — Womble Bond Dickinson (US) LLP

(57) ABSTRACT

A display device includes: an emission line; a pixel configured to emit light in response to an emission signal received from the emission line; a reset line; and a light sensor configured to reset a voltage of a sensing node in response to a reset signal received from the reset line, wherein at least a portion of the reset line overlaps at least a portion of the emission line in a plan view.

20 Claims, 31 Drawing Sheets

(56) References Cited

U.S. PATENT DOCUMENTS

| | | | |
|---|---|---|---|
| 12,067,946 B2* | 8/2024 | Kim | G09G 3/2092 |
| 12,106,601 B2* | 10/2024 | Kim | H10K 39/34 |
| 2022/0214761 A1 | 7/2022 | Kang et al. | |
| 2023/0154411 A1 | 5/2023 | Lee et al. | |
| 2023/0343289 A1 | 10/2023 | Song et al. | |

* cited by examiner

DISPLAY DEVICE AND ELECTRONIC DEVICE INCLUDING THE SAME

CROSS-REFERENCE TO RELATED APPLICATION

The present application claims priority to and the benefit of Korean patent application number 10-2023-0172387, filed on Dec. 1, 2023, in the Korean Intellectual Property Office, the entire disclosure of which is incorporated herein by reference.

BACKGROUND

1. Field

Aspects of some embodiments of the present disclosure relate to a display device and an electronic device including the display device.

2. Description of the Related Art

With the development of information technology, the importance of display devices, which provide a connection medium between a user and information, has been emphasized. Owing to the importance of display devices, the use of various kinds of display devices, such as a liquid crystal display device and an organic light-emitting display device, has increased.

The display device may use pixels to display images. Furthermore, display devices may use a plurality of light sensors to sense the fingerprint of a user and perform user authentication functions. Recently, in-cell display panels with pixels and light sensors formed through the same process have been fabricated.

The above information disclosed in this Background section is only for enhancement of understanding of the background and therefore the information discussed in this Background section does not necessarily constitute prior art.

SUMMARY

Aspects of some embodiments of the present disclosure are directed to a display device capable of removing parasitic capacitance between a pixel and a light sensor, and an electronic device including the display device.

According to some embodiments of the present disclosure a display device includes: an emission line; a pixel configured to emit light in response to an emission signal received from the emission line; a reset line; and a light sensor configured to reset a voltage of a sensing node in response to a reset signal received from the reset line. According to some embodiments, at least a portion of the reset line overlaps at least a portion of the emission line in a plan view.

According to some embodiments, the display device may further include a semiconductor layer. According to some embodiments, an electrode layer in which the reset line is positioned may be between the semiconductor layer and an electrode layer in which the emission line is positioned. According to some embodiments, at least a portion of the reset line may overlap at least a portion of the semiconductor layer in a plan view.

According to some embodiments, the semiconductor layer may be formed of an oxide semiconductor.

According to some embodiments, the semiconductor layer may correspond to the sensing node.

According to some embodiments, the reset line may include a first sub-reset line and a second sub-reset line that are respectively positioned in two different electrode layers. According to some embodiments, at least a portion of the first sub-reset line may overlap at least a portion of the emission line in a plan view. According to some embodiments, the second sub-reset line may be spaced apart from at least a portion of the emission line in a plan view.

According to some embodiments, the display device may further include a semiconductor layer. According to some embodiments, an electrode layer in which the first sub-reset line is positioned may be between the semiconductor layer and an electrode layer in which the emission line is positioned. According to some embodiments, at least a portion of the first sub-reset line may overlap at least a portion of the semiconductor layer in a plan view.

According to some embodiments, the emission line may be positioned in a first direction from the reset line. According to some embodiments, the emission line and the reset line may extend in a second direction to be parallel to each other. According to some embodiments, at least a portion of the reset line may protrude from the reset line in the first direction.

According to some embodiments, the display device may further include a scan line connected to the pixel. According to some embodiments, the light sensor may include a light receiving element, and a sensor circuit contacting an anode electrode of the light receiving element at a first contact point. According to some embodiments, the scan line may be spaced apart from the first contact point, in a plan view.

According to some embodiments, the scan line may be spaced apart from the emission line in a first direction. According to some embodiments, the scan line and the emission line may extend in a second direction to be parallel to each other. According to some embodiments, the scan line may include a portion protruding in the first direction to bypass the first contact point.

According to some embodiments, the scan line may include a first sub-scan line and a second sub-scan line that are respectively positioned in two different electrode layers. According to some embodiments, the first sub-scan line and the second sub-scan line may respectively include portions protruding in the first direction to bypass the first contact point.

According to some embodiments of the present disclosure a display device includes: a scan line; a pixel connected to the scan line; and a light sensor including a light receiving element, and a sensor circuit contacting an anode electrode of the light receiving element at a first contact point. According to some embodiments, the scan line may be spaced apart from the first contact point, in a plan view.

According to some embodiments, the scan line may include a portion protruding in a first direction to bypass the first contact point. According to some embodiments, the scan line may extend in a second direction.

According to some embodiments, the scan line may include a first sub-scan line and a second sub-scan line that are respectively positioned in two different electrode layers. According to some embodiments, the first sub-scan line and the second sub-scan line may respectively include portions protruding in the first direction to bypass the first contact point.

According to some embodiments, the display device may further include an emission line and a reset line. According to some embodiments, the pixel may emit light in response to an emission signal received from the emission line. According to some embodiments, the light sensor may reset a voltage of a sensing node in response to a reset signal received from the reset line. According to some embodiments, at least a portion of the reset line may overlap at least a portion of the emission line in a plan view.

According to some embodiments, the display device may further include a semiconductor layer. According to some embodiments, an electrode layer in which the reset line is positioned may be between the semiconductor layer and an electrode layer in which the emission line is positioned. According to some embodiments, at least a portion of the reset line may overlap at least a portion of the semiconductor layer in a plan view.

According to some embodiments, the semiconductor layer may be formed of an oxide semiconductor.

According to some embodiments, the semiconductor layer may correspond to the sensing node.

According to some embodiments, the reset line may include a first sub-reset line and a second sub-reset line that are respectively positioned in two different electrode layers. According to some embodiments, at least a portion of the first sub-reset line may overlap at least a portion of the emission line in a plan view. According to some embodiments, the second sub-reset line may be spaced apart from at least a portion of the emission line in a plan view.

According to some embodiments, the display device may further include a semiconductor layer. According to some embodiments, an electrode layer in which the first sub-reset line is positioned may be between the semiconductor layer and an electrode layer in which the emission line is positioned. According to some embodiments, at least a portion of the first sub-reset line may overlap at least a portion of the semiconductor layer in a plan view.

According to some embodiments of the present disclosure an electronic device includes: a processor configured to provide input image data to a display device; the display device configured to display an image based on the input image data; and a power supply configured to supply power to the display device. According to some embodiments, the display device may include: an emission line; a pixel configured to emit light in response to an emission signal received from the emission line; a reset line; and a light sensor configured to reset a voltage of a sensing node in response to a reset signal received from the reset line. According to some embodiments, at least a portion of the reset line overlaps at least a portion of the emission line in a plan view.

DETAILED DESCRIPTION

Figure 1:
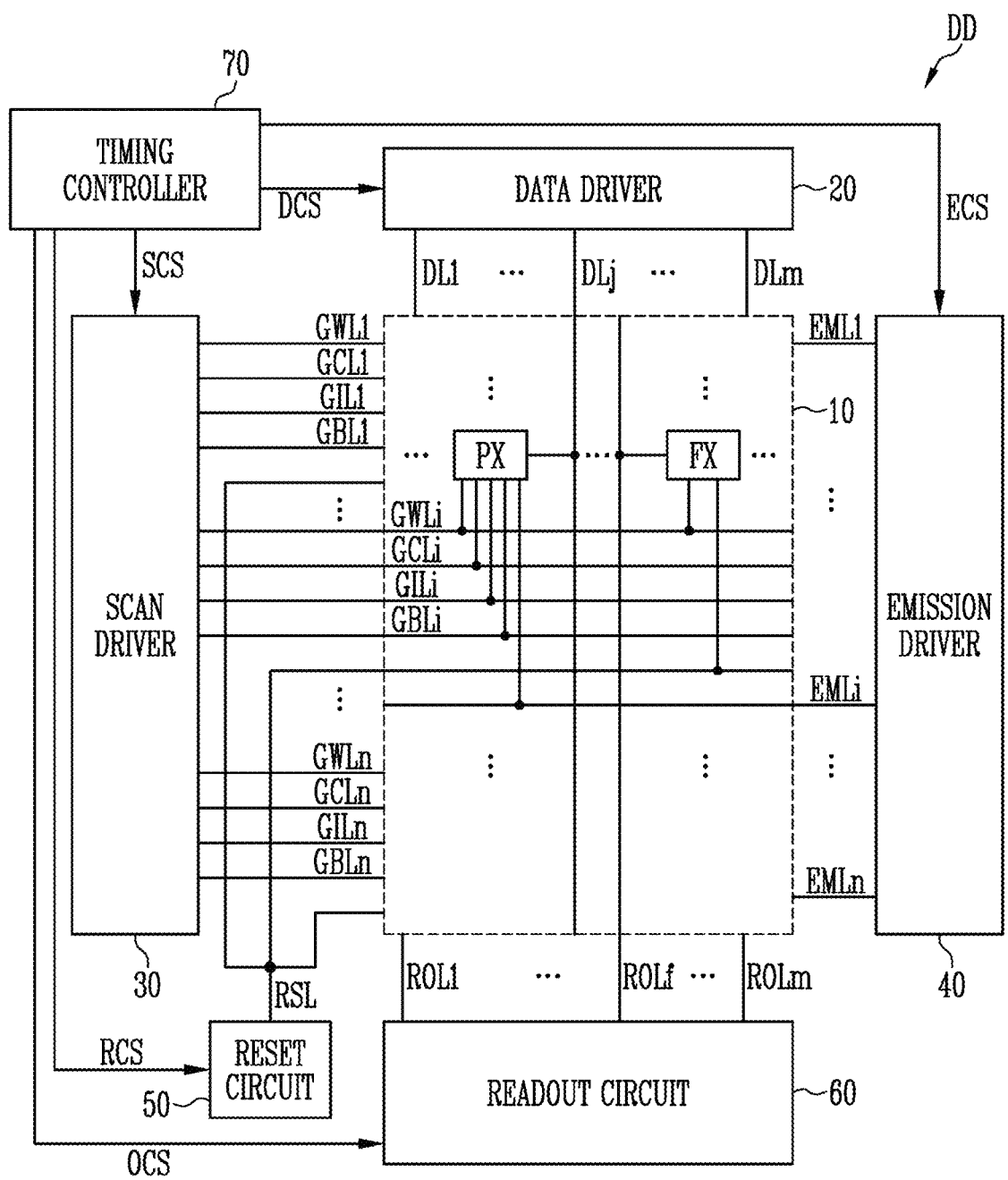
FIG. 1 is a diagram for describing a display device according to some embodiments of the present disclosure.

Hereinafter, aspects of some embodiments of the present invention will be described in more detail with reference to the attached drawings, such that those skilled in the art can implement embodiments according to the present invention. Embodiments according to the present disclosure may be implemented in various forms, and is not limited to the embodiments to be described herein below.

In the drawings, portions which are not related to the present disclosure will be omitted in order to explain the present disclosure more clearly. Reference should be made to the drawings, in which similar reference numerals are used throughout the different drawings to designate similar components. Therefore, the aforementioned reference numerals may be used in other drawings.

For reference, the size of each component and the thicknesses of lines illustrating the component are arbitrarily represented for the sake of explanation, and the present disclosure is not limited to what is illustrated in the drawings. In the drawings, the thicknesses of the components may be exaggerated to clearly depict multiple layers and areas.

Furthermore, the expression "being the same" may mean "being substantially the same". In other words, the expression "being the same" may include a range that can be tolerated by those skilled in the art. The other expressions may also be expressions from which "substantially" has been omitted.

FIG. 1 is a diagram for describing a display device DD according to some embodiments of the present disclosure.

Referring to FIG. 1, the display device DD according to some embodiments of the present disclosure may include a display panel 10, a data driver 20, a scan driver 30, an emission driver 40, a reset circuit 50, a readout circuit 60, and a timing controller 70.

The timing controller 70 may receive grayscale signals and timing signals for each frame period from a processor. Here, the processor may correspond to at least one of a graphics processing unit (GPU), a central processing unit (CPU), an application processor (AP), or the like. The timing signals may include a vertical synchronization signal, a horizontal synchronization signal, a data enable signal, and the like.

Each cycle of the vertical synchronization signal may correspond to each frame period. Each cycle of the horizontal synchronization signal may correspond to each horizontal period. The grayscale signals may be supplied on a horizontal line basis in response to a pulse of an enable level of a data enable signal during each horizontal period. The horizontal line may refer to pixels (e.g., a pixel line) connected to the same scan line and the same emission line.

The timing controller 70 may generate a first control signal SCS, a second control signal ECS, a third control signal DCS, a fourth control signal RCS, and a fifth control signal OCS, based on the received grayscale signals and the received timing signals. The first control signal SCS may be supplied to the scan driver 30. The second control signal ECS may be supplied to the emission driver 40. The third control signal DCS may be supplied to the data driver 20. The fourth control signal RCS may be supplied to the reset circuit 50. The fifth control signal OCS may be supplied to the readout circuit 60. The timing controller 70 may re-order (e.g., render) and correct the grayscale signals and supply the re-ordered and corrected grayscale signals to the data driver 20.

The display panel 10 may include pixels PX connected to data lines DL1, . . . , DLj, . . . , and DLm, scan lines GWL1, . . . , GWLi, . . . , GWLn, GCL1, . . . , GCLi, . . . , GCLn, GIL1, . . . , GILi, . . . , GILn, GBL1, . . . , GBLi, . . . , and GBLn, and emission lines EML1, . . . , EMLi, . . . , and EMLn. Furthermore, the display panel 10 may include light sensors FX connected to the first scan lines GWL1, . . . , GWLi, . . . , and GWLn, a reset line RSL, and readout lines ROL1, . . . , ROLf, . . . , and ROLm. Here, m and n each are an integer greater than 1. The pixels PX may include light emitting elements. The light sensors FX may include light receiving elements.

The data driver 20 may receive the grayscale signals and the third data control signal DCS from the timing controller 70. For example, the third control signal DCS may include a source start signal, a clock signal, and the like. For example, the data driver 20 may shift the source start signal based on the clock signal and sample the grayscale signals, and may apply data voltages corresponding to the sampled grayscale signals to the data lines DL1 to DLm on a pixel row basis.

The scan driver 30 may receive the first control signal SCS from the timing controller 70. The first control signal SCS may include a clock signal, a scan start signal, and the like. The scan driver 30 may supply scan signals to the scan lines GWL1, . . . , GWLi, . . . , GWLn, GCL1, . . . , GCLi, . . . , GCLn, GIL1, . . . , GILi, . . . , GILn, GBL1, . . . , GBLi, . . . , and GBLn, in response to the first control signal SCS.

Although FIG. 1 illustrates embodiments having a configuration in which the scan lines GWL1, . . . , GWLi, . . . , GWLn, GCL1, . . . , GCLi, . . . , GCLn, GIL1, . . . , GILi, . . . , GILn, GBL1, . . . , GBLi, . . . , and GBLn are connected to the single scan driver 30, the present disclosure is not limited thereto. For example, the scan driver 30 may include a first sub-scan driver connected to the first scan lines GWL1, . . . , GWLi, . . . , and GWLn, a second sub-scan driver connected to the second scan lines GCL1, . . . , GCLi, . . . , and GCLn, a third sub-scan driver connected to the third scan lines GIL1, . . . , GILi, . . . , and GILn, and a fourth sub-scan driver connected to the fourth scan lines GBL1, . . . , GBLi, . . . , and GBLn. In another example, the scan driver 30 may be configured to include a first sub-scan driver connected to the scan lines GWL1, . . . , GWLi, . . . , GWLn, GBL1, . . . , GBLi, . . . , and GBLn, and a second sub-scan driver connected to the scan lines GCL1, . . . , GCLi, . . . , GCLn, GIL1, . . . , GILi, . . . , and GILn.

The scan driver 30 or each sub-scan driver may sequentially supply scan signals each having a turn-on level pulse to the corresponding scan lines. The scan driver 30 or each sub-scan driver may include scan stages configured in the form of a shift register. The scan driver 30 or each sub-scan driver may generate scan signals in such a way as to sequentially transmit a scan start signal in the form of a pulse of a turn-on level to a subsequent scan stage under the control of a clock signal.

The emission driver 40 may receive the second control signal ECS from the timing controller 70. The second control signal ECS may include a clock signal, an emission stop signal, and the like. The emission driver 40 may supply emission signals to the emission lines ELM1 to EMLn in response to the second control signal ECS.

The emission driver 40 may sequentially supply emission signals each having a pulse of a turn-on level to the emission lines ELM1 to EMLn. The emission driver 40 may include emission stages configured in the form of shift registers. The emission driver 40 may generate emission signals in such a way as to sequentially transmit an emission stop signal in the form of a pulse of a turn-off level to a subsequent emission stage under the control of a clock signal.

Although FIG. 1 illustrates embodiments in which the scan driver 30 and the emission driver 40 are provided as separate components, embodiments according to the present disclosure are not limited thereto. For example, the scan driver 30 and the emission driver 40 may be integrated into a single driving circuit, a single module, a single chip or component, or the like.

The reset circuit 50 may receive the fourth control signal RCS from the timing controller 70. The reset circuit 50 may apply a reset signal to the reset line RSL in response to the fourth control signal RCS. The reset line RSL may be connected in common to all of the light sensors FX of the display panel 10. In other words, a common reset signal may be transmitted to all of the light sensors FX. According to some embodiments, the reset circuit 50 may be connected to the plurality of light sensors FX through a plurality of reset lines. In this case, a plurality of different reset signals may be transmitted to different light sensors FX.

For sensing, at least some of the pixels PX that are positioned in a selected area may emit light in a sensing pattern. The sensing pattern may be a single color pattern (e.g., a red pattern or a green pattern). The light sensors FX may generate sensing signals corresponding to the received amount of light. The pixels PX that are positioned outside the selected area may continue to display an existing image. The sensing pattern of the pixels that are positioned in the selected area covered with the finger of the user remains invisible to the user, thus allowing the user to continue viewing the existing image.

The readout circuit 60 may receive the fifth control signal OCS from the timing controller 70. The readout circuit 60 may provide sensing information based on sensing signals received from the readout lines ROL1 to ROLm in response to the fifth control signal OCS. The sensing information may be configured in various ways depending on the mode of the display device DD. For example, the sensing information may include fingerprint image information, photoplethysmography information, or the like.

The processor or the timing controller 70 may perform a user authentication function or the like using the sensing information provided from the readout circuit 60.

Figure 2:
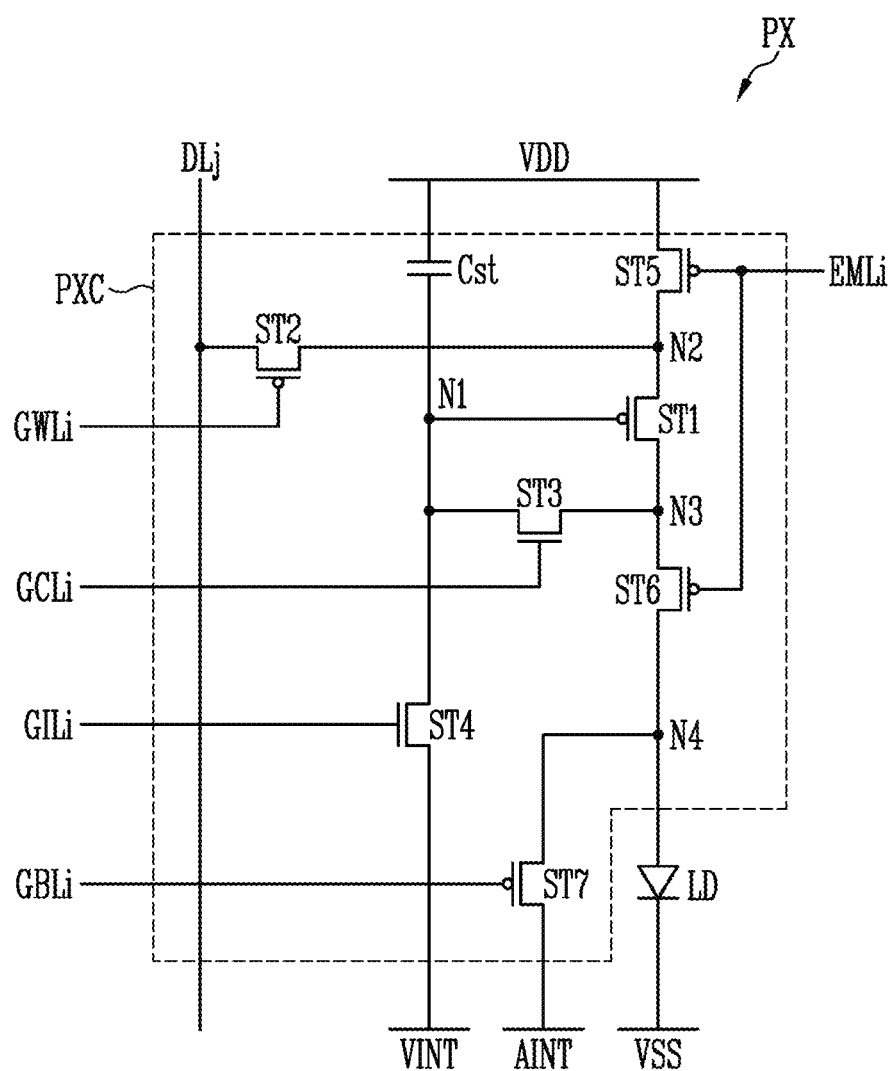
FIG. 2 is a diagram for describing a pixel according to some embodiments of the present disclosure.

FIG. 2 is a diagram for describing a pixel PX according to some embodiments of the present disclosure.

FIG. 2 illustrates a pixel PX located on an i-th pixel row and a j-th pixel column among a plurality of pixels PX. The pixel row may refer to pixels connected to the same scan lines and the same emission line. The pixel column may refer to pixels connected to the same data line. Here, i is an integer of 1 or more and n or less, and j is an integer of 1 or more and m or less.

Referring to FIG. 2, the pixel PXL may include a pixel circuit PXC and a light emitting element LD. The pixel circuit PXC may include pixel transistors ST1 to ST7 and a storage capacitor Cst.

The first pixel transistor ST1 (referred to as a driving transistor) may include a gate electrode connected to a first node N1, a first electrode connected to a second node N2, and a second electrode connected to a third node N3. The first pixel transistor ST1 may control, in response to a voltage of the first node N1, driving current flowing from a first power supply (or first power voltage) VDD to a second power supply (or second power voltage) VSS via the light emitting element LD.

The second pixel transistor ST2 (referred to as a switching transistor) may include a first electrode connected to a data line DLj, a second electrode connected to the second node N2, and a gate electrode connected to the first scan line GWLi. When a first scan signal of a turn-on level is supplied to the first scan line GWLi, the second pixel transistor ST2 may be turned on so that the data line DLj and the second node N2 can be electrically connected to each other.

The third pixel transistor ST3 (referred to as a diode-connected transistor) may include a first electrode connected to the first node N1, a second electrode connected to the third node N3, and a gate electrode connected to the second scan line GCLi. When a second scan signal of a turn-on level is supplied to the second scan line GCLi, the third pixel transistor ST3 may be turned on so that the gate electrode and the second electrode of the first pixel transistor ST1 can be electrically connected to each other. In other words, when the third pixel transistor ST3 is turned on, the first pixel transistor ST1 may be connected in the form of a diode.

The fourth pixel transistor ST4 (referred to as a gate initialization transistor) may include a first electrode connected to the first node N1, a second electrode connected to a first initialization voltage line to which a first initialization voltage VINT is to be applied, and a gate electrode connected to the third scan line GILi. When a third scan signal of a turn-on level is supplied to the third scan line GILi, the fourth pixel transistor ST4 may be turned on so that the first initialization voltage VINT can be applied to the first node N1.

The fifth pixel transistor ST5 (referred to as a first emission transistor) may include a first electrode connected to a first power line to which the first power voltage VDD is to be applied, a second electrode connected to the first node N1, and a gate electrode connected to the emission line EMLi. The fifth pixel transistor ST5 may be 1 turned off when an emission signal of a turn-off level is supplied to the emission line EMLi, and may be turned on in the other cases.

The sixth pixel transistor ST6 (referred to as a second emission transistor) may include a first electrode connected to the third node N3, a second electrode connected to a fourth node N4, and a gate electrode connected to the emission line EMLi. The sixth pixel transistor ST6 may be turned off when an emission signal of a turn-off level is supplied to the emission line EMLi, and may be turned on in the other cases. The pixel PX may emit light in response to an emission signal received from the emission line EMLi. In other words, the emission timing of the pixel PX may be determined based on the emission signal received from the emission line EMLi.

The seventh pixel transistor ST7 (referred to as an anode initialization transistor) may include a first electrode connected to the fourth node N4, a second electrode connected to a second initialization voltage line to which a second initialization voltage AINT is to be applied, and a gate electrode connected to the fourth scan line GBLi. When a fourth scan signal of a turn-on level is supplied to the fourth scan line GBLi, the seventh pixel transistor ST7 may be turned on so that the second initialization voltage AINT can be applied to the fourth node N4. For example, an i-th fourth line GBLi may be the same as an i−1-th first scan line GWLi.

Each of some transistors ST1, ST2, ST5, ST6, and ST7 among the pixel transistors ST1 to ST7 may be a P-type transistor, and each of the other transistors ST3 and ST4 may be an N-type transistor, but not limited to thereto. For example, each of the pixel transistors ST1 to ST7 may be a P-type transistor or an N-type transistor.

The P-type transistors may be poly-silicon transistors. In each of the poly-silicon transistors, a channel of a semiconductor layer may include poly-silicon. For example, the poly-silicon transistor may be a low temperature poly-silicon (LTPS) thin-film transistor. The poly-silicon transistor may have high electron mobility and thus have high-speed driving characteristics.

N-type transistors may be oxide transistors. In each of the oxide transistors, a channel of a semiconductor layer may include an oxide semiconductor. For example, an oxide transistor may be a low-temperature polycrystalline oxide (LTPO) thin-film transistor. The oxide transistor may have charge mobility lower than the poly-silicon. Therefore, the amount of leakage current in oxide transistors that is in a turn-off state may be less than that of poly-silicon transistors. Hereinbelow, such descriptions will be omitted.

The storage capacitor Cst may include a first electrode connected to the first power line to which the first power voltage VDD is to be applied, and a second electrode connected to the first node N1.

The light emitting diode LD may include an anode electrode connected to the fourth node N4, and a cathode electrode connected to the second power line to which the second power voltage VSS is to be applied. The light emitting element LD may be a light emitting diode. The light emitting element LD may be formed of an organic light emitting diode, an inorganic light emitting diode, a quantum dot/well light emitting diode, or the like. The light emitting element LD may emit light having any one of a first color, a second color, and a third color. Although in the present embodiments only one light emitting element LD is provided in each pixel, a plurality of light emitting elements may be provided in each pixel according to some embodiments. Here, the plurality of light emitting elements may be connected in series, parallel, or series-parallel to each other.

Figure 3:
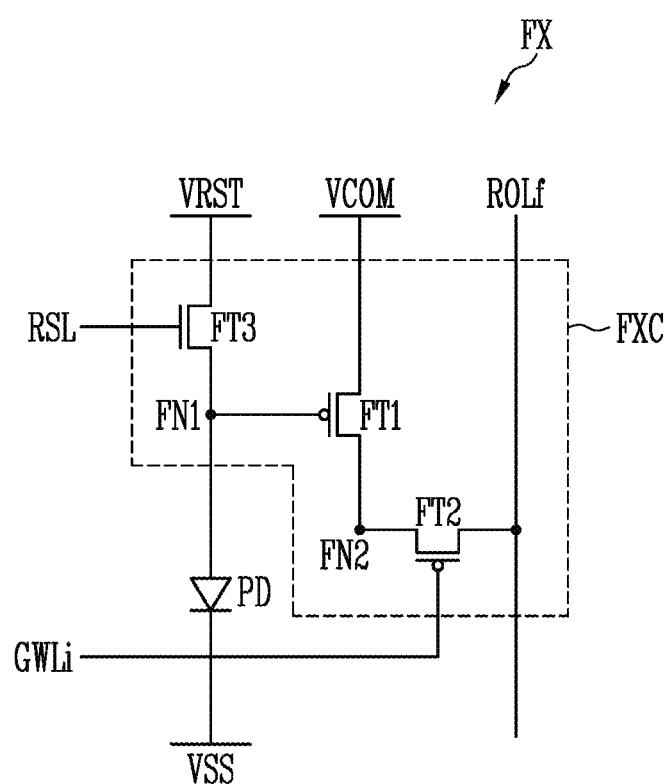
FIG. 3 is a diagram illustrating a light sensor according to some embodiments of the present disclosure.

FIG. 3 is a diagram illustrating a light sensor FX according to some embodiments of the present disclosure.

Referring to FIG. 3, the light sensor FX may include a sensor circuit FXC and a light receiving element PD. The sensor circuit FXC may include sensing transistors FT1 to FT3. The sensor circuit FXC may be connected to an anode electrode of the light receiving element PD on a first node FN1.

The first sensing transistor FT1 (referred to as an amplifying transistor) may include a first electrode connected to a common voltage line to which a common voltage VCOM is to be applied, a second electrode connected to the second node FN2, and a gate electrode connected to the first node FN1. The first sensing transistor FT1 may control sensing current flowing through the first sensing transistor FT1, in response to a voltage of the first node FN1. The sensing current may be supplied, as a sensing signal, to a readout line ROLf via the second sensing transistor FT2. The first node FN1 may be referred to as a sensing node.

The second sensing transistor FT2 (referred to as an output transistor) may include a first electrode connected to a second node FN2, a second electrode connected to the readout line ROLf, and a gate electrode connected to the first scan line GWLi. In other words, the gate electrode of the second sensing transistor FT2 and the gate electrode of the second pixel transistor ST2 may be connected to the same scan line, i.e., the first scan line GWLi. When a first scan signal of a turn-on level is supplied to the first scan line GWLi, the second sensing transistor FT2 may be turned on so that the second electrode of the first sensing transistor FT1 and the readout line ROLf can be electrically connected to each other.

The third sensing transistor FT3 (referred to as a reset transistor) may include a first electrode connected to a reset voltage line to which a reset voltage VRST is to be applied, a second electrode connected to the first node FN1, and a gate electrode connected to the reset line RSL. The light sensor FX may reset the voltage of the sensing node (i.e., the first node FN1) in response to a reset signal received from the reset line RSL. When a reset signal of a turn-on level is supplied to the reset line RSL, the third sensing transistor FT3 may be turned on so that the reset voltage VRST can be supplied to the first node FN1. The first node FN1, i.e., the gate electrode of the first sensing transistor FT1, may be reset by the reset voltage VRST. The reset voltage VRST may be set to be less than the second power voltage VSS.

Each of some transistors FT1 and FT2 among the sensing transistors FT1 to FT3 may be a P-type transistor, and the other transistor FT3 may be an N-type transistor, but not limited to thereto. For example, each of the sensing transistors FT1 to FT3 may be a P-type transistor or an N-type transistor.

The light receiving element PD may include a first electrode (or an anode electrode) connected to the first node FN1, and a second electrode (or a cathode electrode) connected to the second power line to which the second power voltage VSS is to be applied. The light receiving element PD may be a photo diode. However, according to some embodiments, the light receiving element PD may be formed of a photo transistor. In the light receiving element PD, when light is received, electrons are excited, thus allowing reverse current to flow in a direction from the cathode electrode to the anode electrode. Therefore, if the light receiving element PD is exposed to light, the voltage of the first node FN1 may gradually increase after a reset time point. As a light receiving time or light intensity increases, an increment in voltage of the first node FN1 after the reset time point may increase. Therefore, the magnitude of sensing current flowing through the readout line ROLf may vary depending on the light receiving time and the light intensity.

Figure 4:
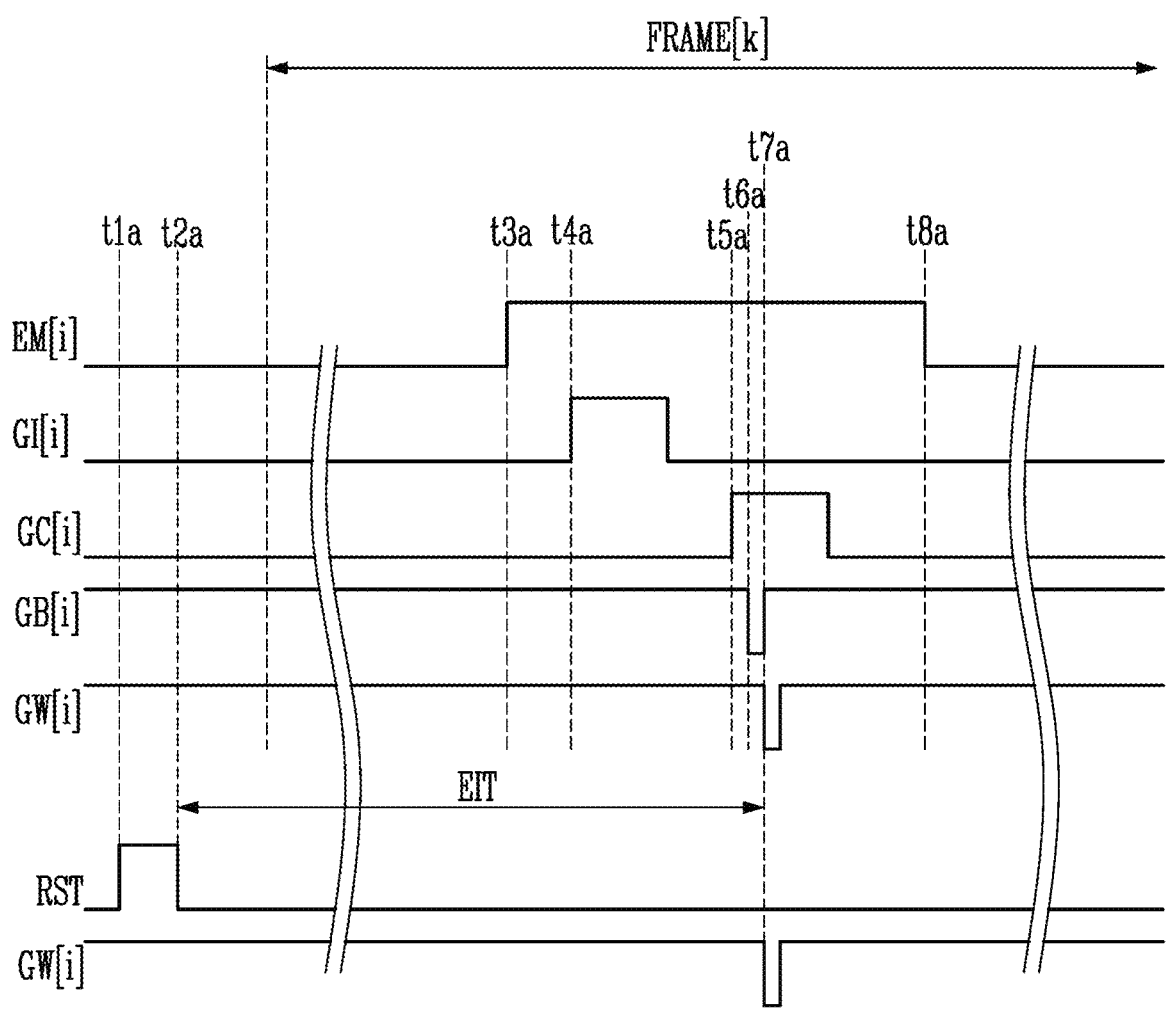
FIG. 4 is a diagram for describing a method of driving the pixel and the light sensor according to some embodiments of the present disclosure.

FIG. 4 is a diagram for describing a method of driving the pixel PX and the light sensor FX according to some embodiments of the present disclosure.

FIG. 4 illustrates a process during which the pixel PX of FIG. 2 and the light sensor FX of FIG. 3 are operated in a k-th frame period FRAME[k].

First, during a period from t1a to t2a before the k-th frame period FRAME[k], a reset signal RST of a turn-on level may be applied to the reset line RSL. Therefore, the first node FN1 of the light sensor FX may be reset by a reset voltage VRST. After the time point t2a, the voltage of the first node FN1 gradually increases depending on the length of a light receiving period EIT and the light intensity.

At a time point t3a, an emission signal EM[i] of a turn-off level is supplied to the emission line EMLi. Hence, the fifth pixel transistor ST5 and the sixth pixel transistor ST6 are turned off, thus preventing the light emitting element LD from emitting light.

At a time point t4a, a third scan signal GI[i] of a turn-on level is supplied to the third scan line GILi. Hence, the fourth pixel transistor ST4 is turned on, and the first node N1 is initialized to the first initialization voltage VINT.

At a time point t5a, a second scan signal GC[i] of a turn-on level is supplied to the second scan line GCLi. Hence, the third pixel transistor ST3 is turned on, and the first pixel transistor ST1 enters a diode-connected state.

At a time point t6a, a fourth scan signal GB[i] of a turn-on level is supplied to the fourth scan line GBLi. Hence, the seventh pixel transistor ST7 is turned on, and the fourth node N4 is initialized to the second initialization voltage AINT. The second initialization voltage AINT may be set to be the same as or less than the second power voltage VSS, so that it is advantageous in terms of low grayscale expression of the light emitting element LD.

At a time point t7a, a first scan signal GW[i] of a turn-on level is supplied to the first scan line GWLi. Hence, the second pixel transistor ST2 is turned on, and a data voltage is applied to the second node N2. Here, the first node N1 is in a state of having been supplied with the first initialization voltage VINT. The first initialization voltage VINT may be a voltage sufficiently less than data voltages. Therefore, the first pixel transistor ST1 may be turned on, so that a corrected data voltage obtained by reflecting a threshold voltage decrement in the data voltage may be applied to the first node N1. The storage capacitor Cst may maintain a voltage corresponding to a difference between the first power voltage VDD and the compensation data voltage. This period may be referred to as a threshold voltage compensation period or a data write period.

Furthermore, at a time point t7a, the second sensing transistor FT2 is turned on by the first scan signal GW[i] of a turn-on level. Hence, sensing current corresponding to the light receiving period EIT and the light intensity may flow through the readout line ROLf.

At a time point t8a, the emission signal EM[i] of a turn-on level is supplied to the emission line EMLi. Hence, the fifth pixel transistor ST5 and the sixth pixel transistor ST6 are turned on, so that the light emitting element LD enters an emission-enable state.

Here, a driving current path that connects the first power line, the fifth pixel transistor ST5, the first pixel transistor ST1, the sixth pixel transistor ST6, the light emitting element LD, and the second power line may be formed. The amount of driving current that flows through the first electrode and the second electrode of the first pixel transistor ST1 may be adjusted in response to the voltage maintained in the storage capacitor Cst. The light emitting element LD may emit light at a luminance corresponding to the amount of driving current. The light emitting element LD may emit light until the emission signal EM[i] of a turn-off level is applied to the emission line EMLi.

Figure 5:
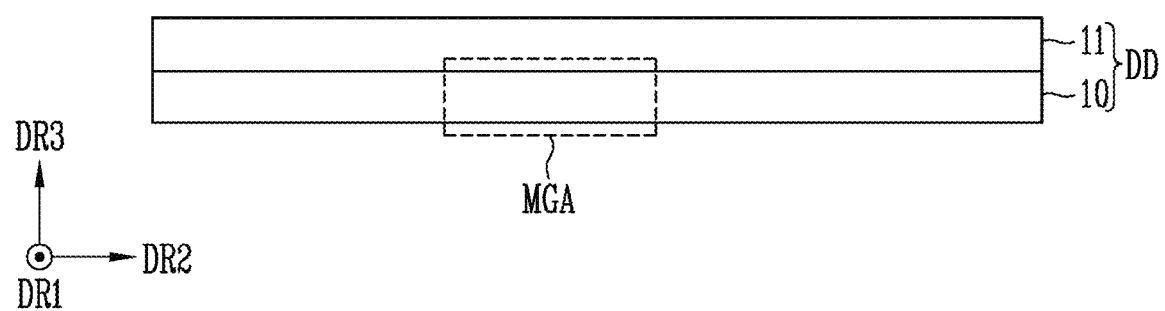
FIG. 5 is a diagram for describing a stacking relationship of a display panel and a touch sensor according to some embodiments of the present disclosure.

FIG. 5 is a diagram for describing a stacking relationship of the display panel 10 and a touch sensor 11.

Referring to FIG. 5, the display device DD may include the display panel 10 and the touch sensor 11. The display panel 10 may be a plate-type display panel extending in a first direction DR1 and a second direction DR2. The first direction DR1 and the second direction DR2 may be perpendicular to each other. Likewise, the touch sensor 11 may be a plate-type touch sensor extending in the first direction DR1 and the second direction DR2.

The touch sensor 11 may be arranged in a third direction DR3 of the display panel 10. The third direction DR3 may be perpendicular to the first direction DR1 and the second direction DR2. The third direction DR3 may be an image display direction of the display panel 10. The user may view images in the third direction DR3 of the display panel 10 and touch the touch sensor 11 so that the user can intuitively control the display device DD. The touch sensor 11 may be implemented as a touch sensor such as a mutual-capacitance touch sensor, or a self-capacitance touch sensor. According to some embodiments, the display panel 10 and the touch sensor 11 may be integrally fabricated.

Figure 6:
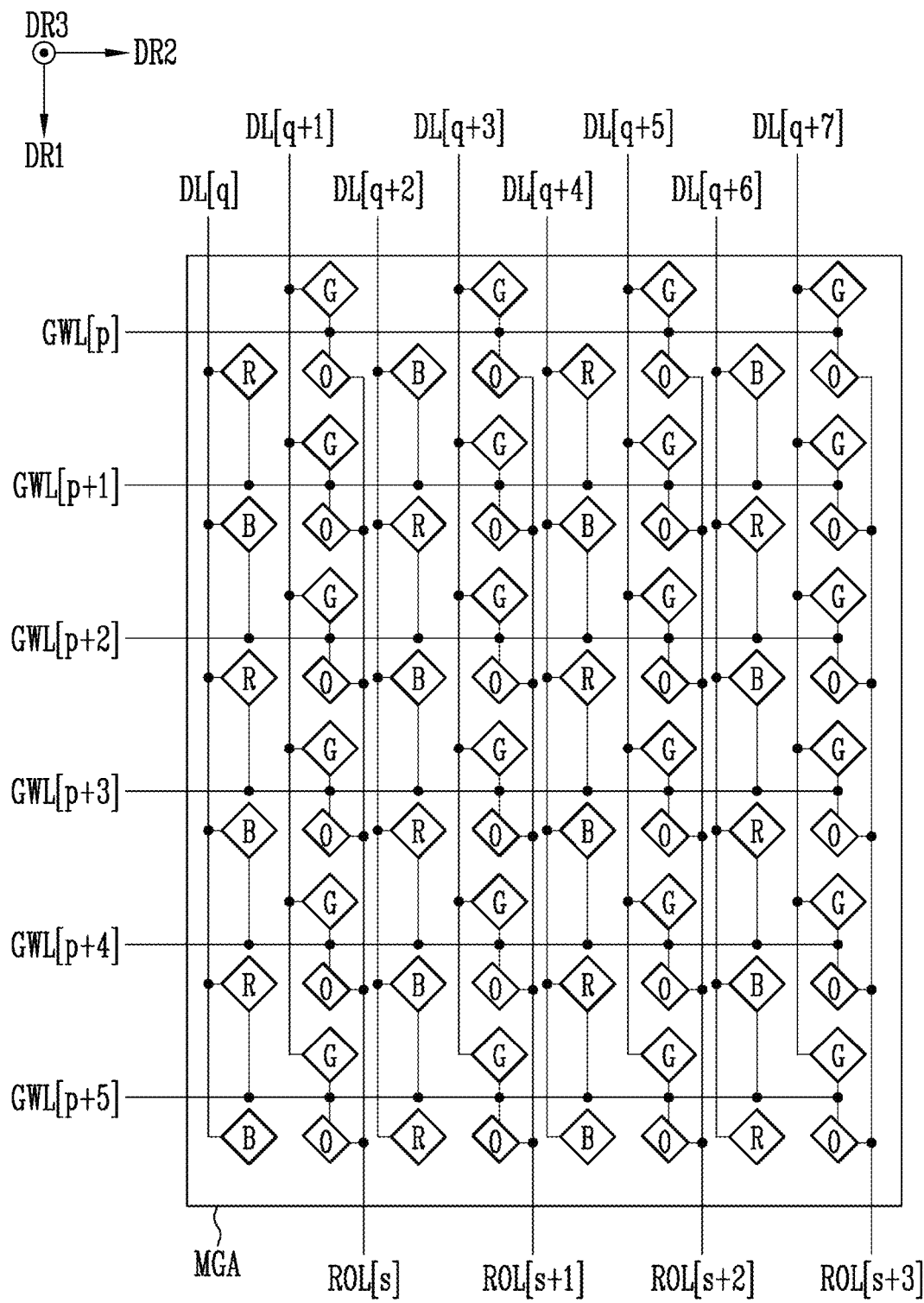
FIG. 6 is an enlarged view of a portion of the display panel of FIG. 5.

FIG. 6 is an enlarged view of portion MGA of the display panel 10 of FIG. 5.

The pixels PX may be connected to first scan lines GWL[p] to GWL[p+5], and may include light emitting elements R, G, and B. The first scan lines GWL[p]~GWL[p+5] may be arranged parallel to each other in the first direction DR1. The first scan lines GWL[p] to GWL[p+5] may extend in the second direction DR2. Here, p is an integer greater than 0. Furthermore, the pixels PX may be connected to data lines DL[q] to DL[q+7]. The data lines DL[q] to DL[q+7] may extend in the first direction DR1, and may be arranged parallel to each other in the second direction DR2. Here, q is an integer greater than 0.

Each of the light emitting elements R, G, and B of the pixels PX may emit one of light in a first color, light in a second color, and light in a third color. The first color, the second color, and the third color may be different colors. For example, the first color may be one of red, green, and blue. The second color may be one of red, green, and blue, other than the first color. The third color may be the remaining color among the red, green, and blue, other than the first color and the second color. Furthermore, magenta, cyan, and yellow, in lieu of red, green, and blue, may be used as the first to third colors.

In the present embodiments, it is illustrated that the light emitting elements R, G, and B of the pixels PX are arranged in a diamond pixel (DIAMOND PIXEL™) or pentile (PENTILE™) structure. The illustrated connection relationship between the first scan lines GWL[p] to GWL[p+5], the data lines DL[q] to DL[q+7], and the pixels PX is only for illustrative, and may be changed. For example, the pixels PX including the light emitting elements R and B of the first color and the third color may be connected in common to the same data line DL[q], DL[q+2], DL[q+4], or DL[q+6], and the pixels PX including the light emitting elements G of the second color may be connected to an independent data line DL[q+1], DL[q+3], DL[q+5], or DL[q+7]. The data lines DL[q], DL[q+2], DL[q+4], and DL[q+6] to which the pixels PX including the light emitting elements R and B of the first color and the third color are connected, and the data lines DL[q+1], DL[q+3], DL[q+5], and DL[q+7] to which the pixels PX including the light emitting elements G of the second color are connected may be alternately arranged.

The light sensors FX including light receiving elements O may be connected to the first scan lines GWL[p] to GWL[p+5] and readout lines ROL[s] to ROL[s+3]. The readout lines ROL[s] to ROL[s+3] may extend in the first direction DR1 and may be arranged parallel to each other in the second direction DR2.

FIGS. 7 to 17 are diagrams for describing a layout of the pixel and the light sensor according to some embodiments of the present disclosure.

FIGS. 7 to 16 illustrate electrode layers CEL1 to CEL8 and semiconductor layers ACL1 and ACL2 in a stacking sequence. FIG. 17 illustrates a sectional view taken along line I-I' of FIG. 16.

The substrate SUB may be formed of various materials such as glass, a polymer, and metal. Any one of a rigid substrate and a flexile substrate may be selected as the substrate SUB depending on applied products. In the case where the substrate SUB is formed to include polymer organic material, the substrate SUB may be made of material such as polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, or cellulose acetate propionate. On the other hand, the substrate SUB may be formed of fiber glass reinforced plastic (FRP).

The first semiconductor layer ACL1 and the second semiconductor layer ACL2 may be semiconductor layers including different materials. For example, the first semiconductor layer ACL1 may be formed of poly silicon, and the second semiconductor layer ACL2 may be formed of an oxide semiconductor. The first semiconductor layer ACL1 may include the channels, the first electrodes, and the second electrodes of the respective transistors ST1, ST2, ST5, ST6, ST7, FT1, and FT2. The second semiconductor layer ACL2 may include the channels, the first electrodes, and the second electrodes of the respective transistors ST3, ST3, and FT3. The first electrode and the second electrode of each of the transistors ST1 to FT3 may be doped with impurities.

Each of the electrode layers CEL1 to CEL8 may be a conductive layer. Each electrode layer may have a single-layer structure or a multilayer structure, and may be formed using a known conductor made of material such as gold (Au), silver (Ag), aluminum (Al), molybdenum (Mo), chromium (Cr), titanium (Ti), nickel (Ni), neodymium (Nd), copper (Cu), or platinum (Pt). Each of the electrode layers CEL1 to CEL8 may be formed of a transparent conductor made of material such as ITO, IZO, ZnO, or ITZO. Each of the electrode layers CEL1 to CEL8 may include both a transparent conductor and an opaque conductor.

Insulating layer INS1, INS2, INS3, INS4, INS5, INS6, VIA1, VIA2, and VIA3 may be positioned between the electrode layers CEL1 to CEL8 and the semiconductor layers ACL1 and ACL2. The insulating layers INS1, INS2, INS3, INS4, INS5, INS6, VIA1, VIA2, and VIA3 may be interposed to electrically separate the electrode layers CEL1 to CEL8 and the semiconductor layers ACL1 and ACL2 from each other. The needed semiconductor patterns/electrode patterns may be connected to each other through contact holes formed in the insulating layers INS1, INS2, INS3, INS4, INS5, INS6, VIA1, VIA2, and VIA3. The insulating layers INS1, INS2, INS3, INS4, INS5, INS6, VIA1, VIA2, and VIA3 may be formed of an organic insulating layer, an inorganic insulating layer, or an organic/inorganic insulating layer, and may have a single-layer structure or a multilayer structure. For example, each of the insulating layers INS1, INS2, INS3, INS4, INS5, INS6, VIA1, VIA2, and VIA3 may include at least one of silicon nitride ($SiN_x$), silicon oxide ($SiO_x$), silicon oxynitride ($SiO_xN_y$), acryl resin, epoxy resin, phenolic resin, polyamide resin, or polyimide resin.

Figure 7:
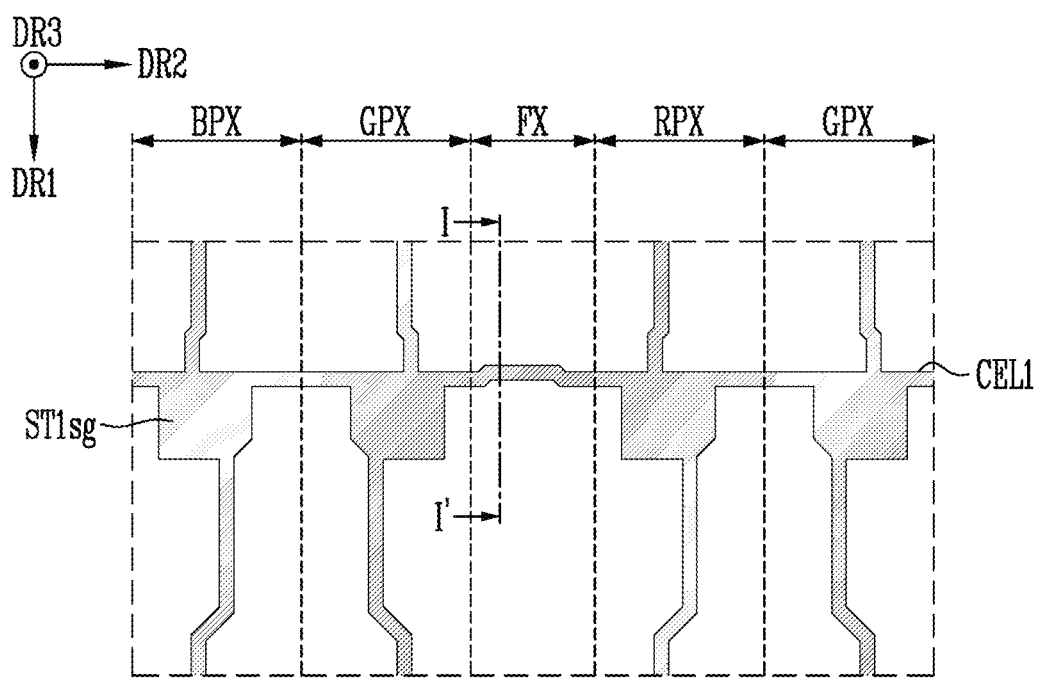
FIGS. 7 to 17 are diagrams for describing a layout of the pixel and the light sensor according to some embodiments of the present disclosure.

Referring to FIG. 7, there are illustrated aspects of patterns of the first electrode layer CEL1 according to some embodiments. Some patterns of the first electrode layer CEL1 may form a sub-gate electrode ST1sg of the first pixel transistor ST1. The sub-gate electrode ST1sg may be provided to block light or supply a body voltage of the first pixel transistor ST1.

For example, a third-color pixel BPX, a second-color pixel GPX, a light sensor FX, a first-color pixel RPX, and a second-color pixel GPX may be arranged in the second direction DR2. The layout of the first-color pixel RPX may be the same as the layout of the third-color pixel BPX. The layout of the second-color pixel GPX may be symmetrical to the layout of the third-color pixel BPX in the second direction DR2. Therefore, hereinafter, only the layout of the third-color pixel BPX and the layout of the light sensor FX will be described.

Figure 8:
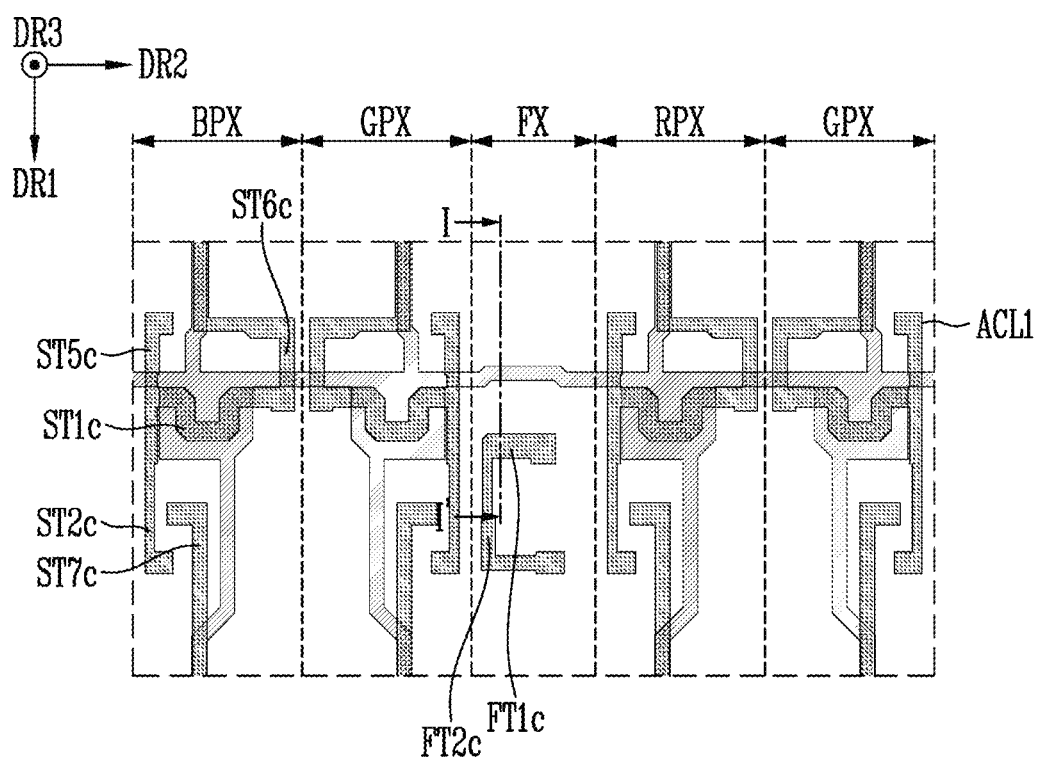

Referring to FIG. 8, there are illustrated aspects of patterns of the first semiconductor layer ACL1 according to some embodiments. The first semiconductor layer ACL1 may include respective channels ST1c, ST2c, ST5c, ST6c, ST7c, FT1c, and FT2c of the transistors ST1, ST2, ST5, ST6, ST7, FT1, and FT2. Respective portions of the first semiconductor layer ACL1 that are spaced apart from each other with the channels interposed therebetween may constitute the first electrodes and the second electrodes of the transistors ST1, ST2, ST5, ST6, ST7, FT1, and FT2.

Figure 9:
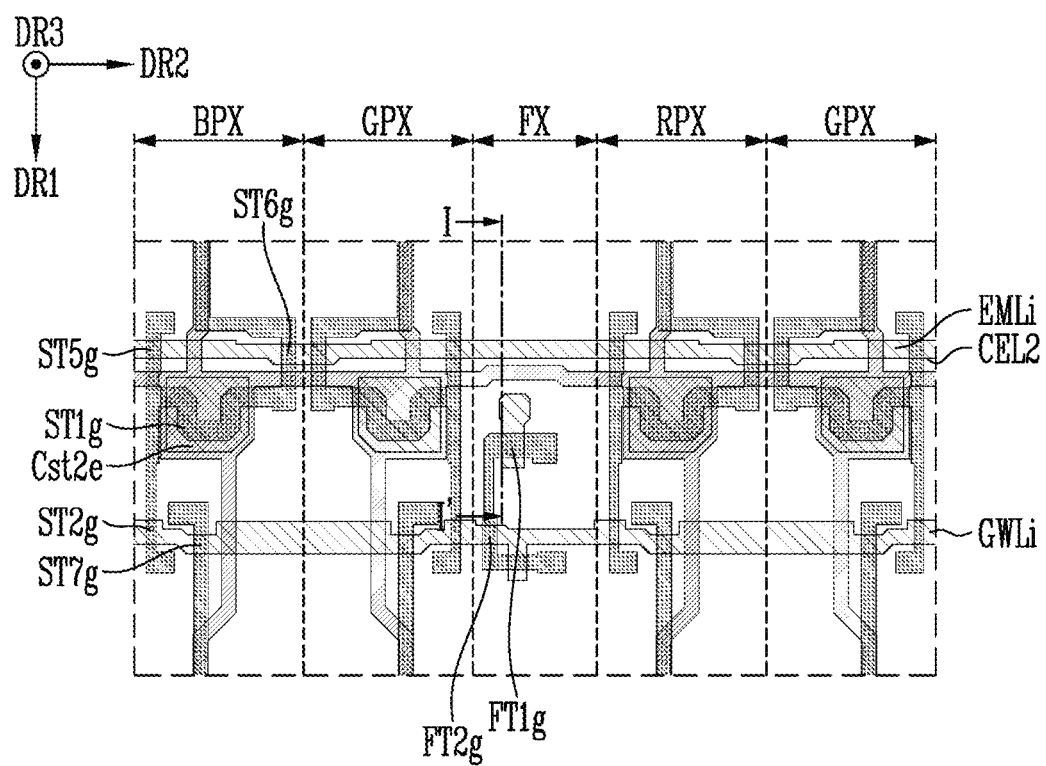

Referring to FIG. 9, there are illustrated aspects of patterns of the second electrode layer CEL2 according to some embodiments. The second electrode layer CEL2 may include the respective gate electrodes ST1g, ST2g, ST5g, ST6g, ST7g, FT1g, and FT2g of the transistors ST1, ST2, ST5, ST6, ST7, FT1, and FT2. The gate electrodes ST1g, ST2g, ST5g, ST6g, ST7g, FT1g, and FT2g may overlap the channels ST1c, ST2c, ST5c, ST6c, ST7c, FT1c, and FT2c.

Furthermore, some patterns of the second electrode layer CEL2 may constitute the first scan line GWLi, the emission line EMLi, and the second electrode Cst2e of the storage capacitor Cst.

Figure 10:
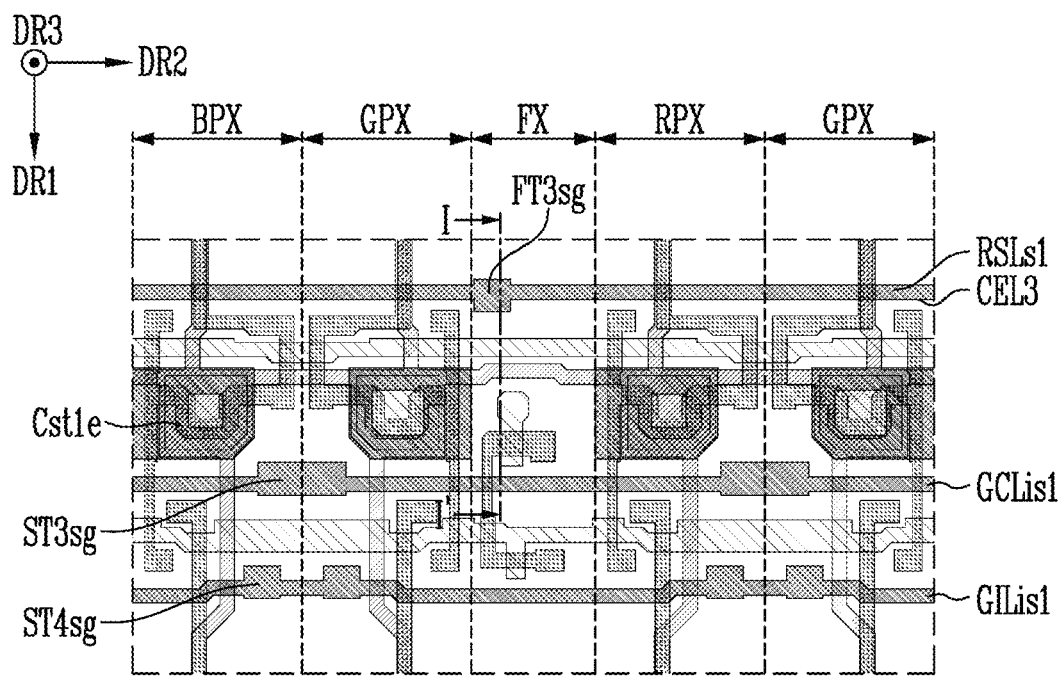

Referring to FIG. 10, there are illustrated patterns of the third electrode layer CEL3 according to some embodiments. Some patterns of the third electrode layer CEL3 may include sub-gate electrodes ST3sg, ST4sg, and FT3sg of the transistors ST3, ST4, and FT3, the first electrode Cst1e of the storage capacitor Cst, a first sub-reset line RSLs1 of the reset line RSL, a 2-1-th sub-scan line GCLis1 of the second scan line GCLi, and a 3-1-th sub-scan line GILis1 of the third scan line GILi.

Figure 11:
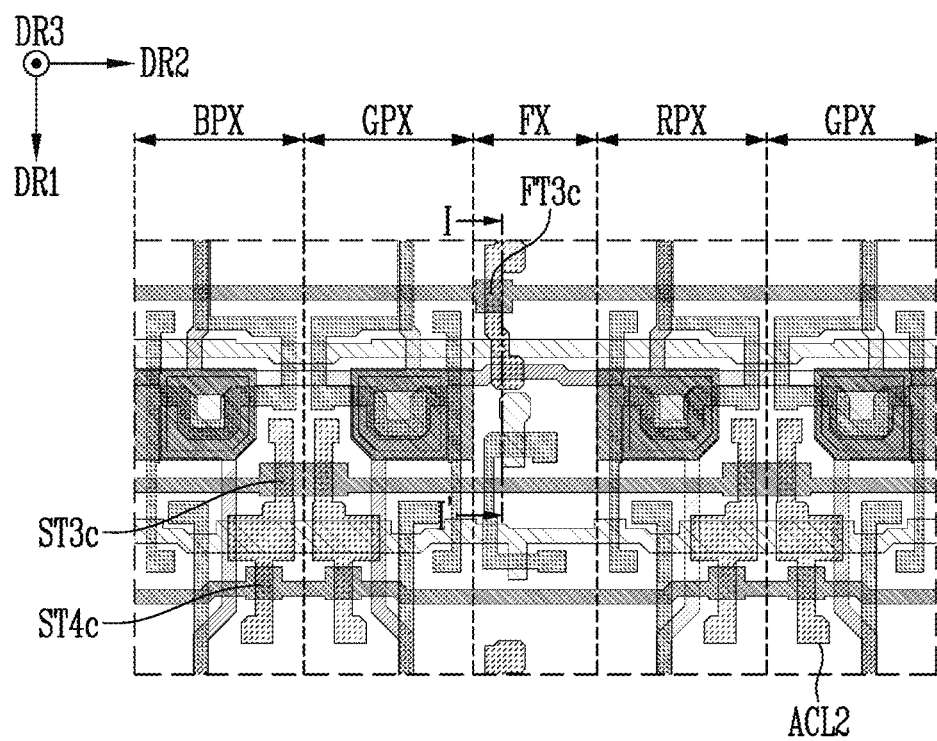

Referring to FIG. 11, there are illustrated patterns of the second semiconductor layer ACL2 according to some embodiments. The second semiconductor layer ACL2 may include the channels ST3c, ST4c, and FT3c of the transistors ST3, ST4, and FT3. Respective portions of the second semiconductor layer ACL2 that are spaced apart from each other with the channels interposed therebetween may constitute the first electrodes and the second electrodes of the transistors ST3, ST4, and FT3.

Figure 12:
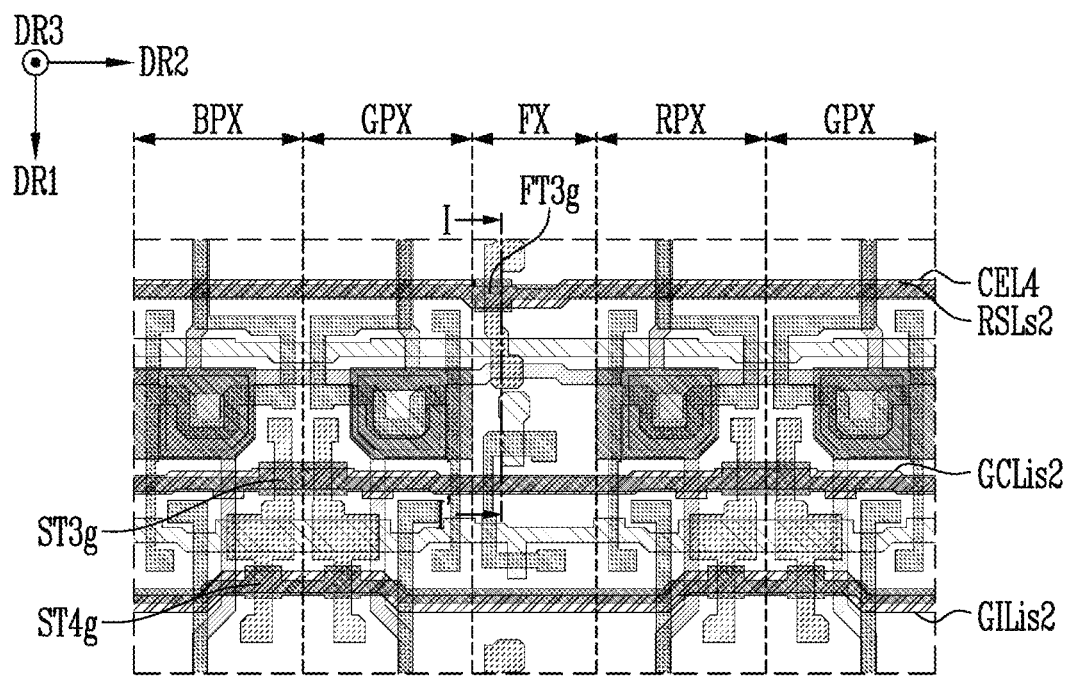

Referring to FIG. 12, there are illustrated patterns of the fourth electrode layer CEL4 according to some embodiments. The fourth electrode layer CEL4 may include the gate electrodes ST3g, ST4g, and FT3g of the transistors ST3, ST4, and FT3. The gate electrodes ST3g, ST4g, and FT3g may overlap the channels ST3c, ST4c, and FT3c.

Furthermore, some patterns of the fourth electrode layer CEL4 may include a second sub-reset line RSLs2 of the reset line RSL, a 2-2-th sub-scan line GCLis2 of the second scan line GCLi, and a 3-2-th sub-scan line GILis2 of the third scan line GILi.

Figure 13:
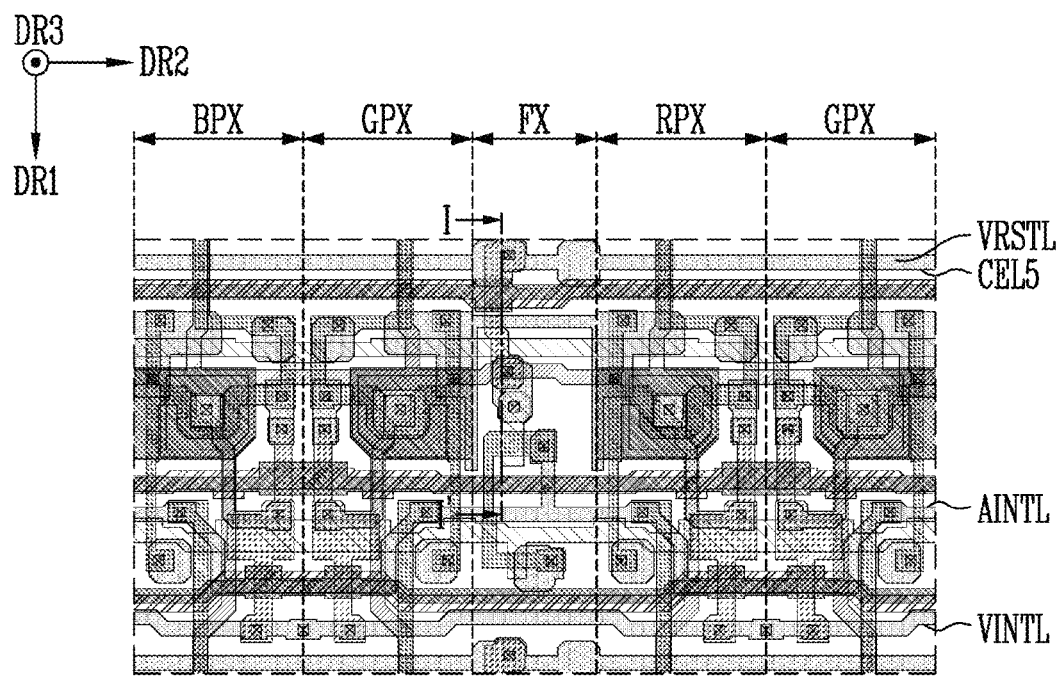

Referring to FIG. 13, there are illustrated patterns of the fifth electrode layer CEL5 according to some embodiments. Some patterns of the fifth electrode layer CEL5 may include the reset voltage line VRSTL, the first initialization voltage line VINTL, and the second initialization voltage line AINTL.

A reset voltage VRST may be applied to the reset voltage line VRSTL. A first initialization voltage VINT may be applied to the first initialization voltage line VINTL. A second initialization voltage AINT may be applied to the second initialization voltage line AINTL.

Figure 14:
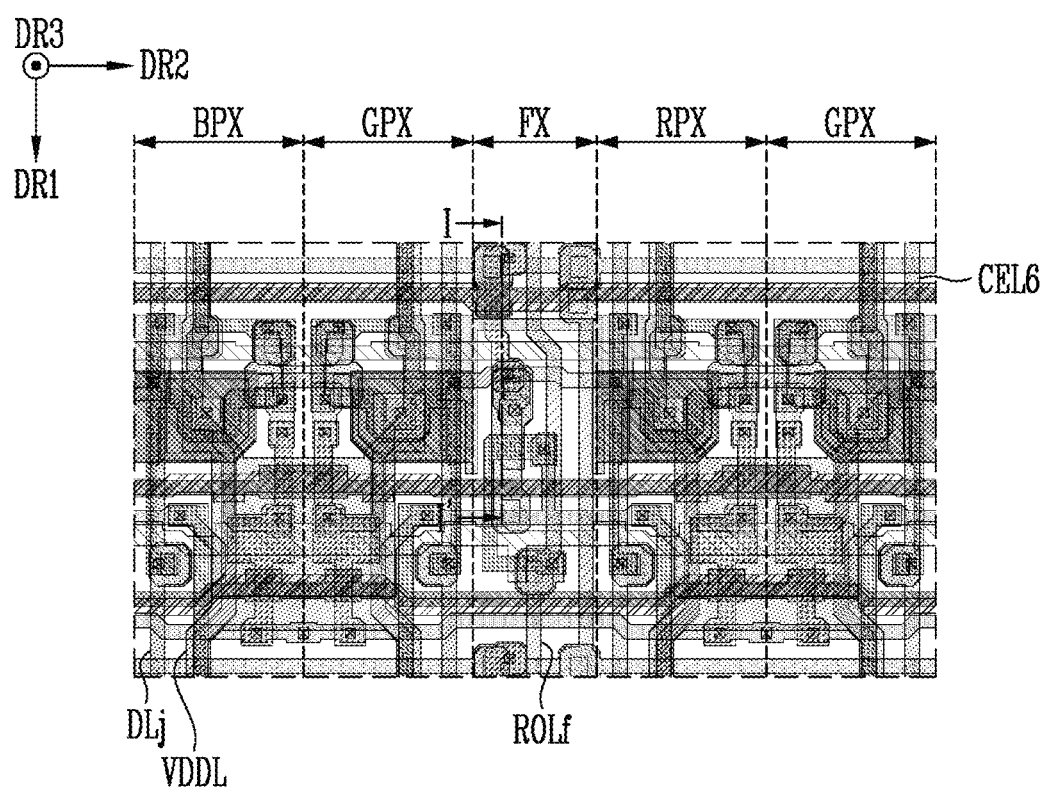

Referring to FIG. 14, there are illustrated patterns of the sixth electrode layer CEL6 according to some embodiments. Some patterns of the sixth electrode layer CEL6 may include the first power line VDDL, the data line DLj, and the readout line ROLf. A first power voltage VDD may be applied to the first power line VDDL.

Figure 15:
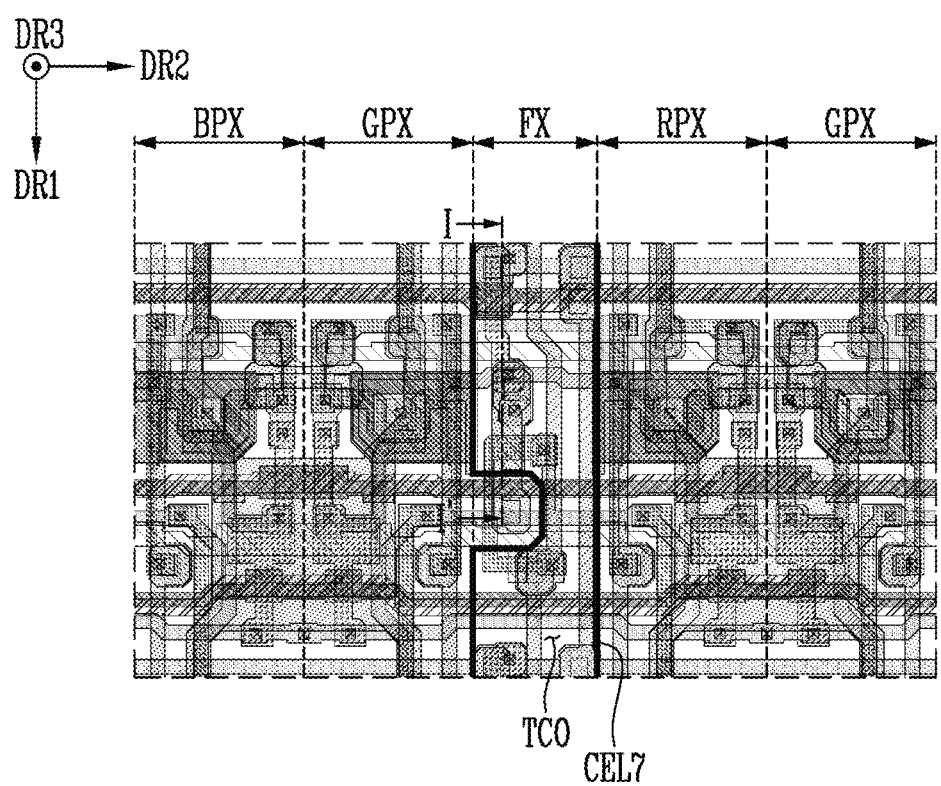

Referring to FIG. 15, there are illustrated patterns of the seventh electrode layer CEL7 according to some embodiments. Some patterns of the seventh electrode layer CEL7 may include a shielding electrode TCO. The shielding electrode TCO may electrically shield the readout line ROLf from a signal of an eighth electrode layer CEL8 to be described later. For example, the shielding electrode TCO may be formed of a transparent conductor.

Figure 16:
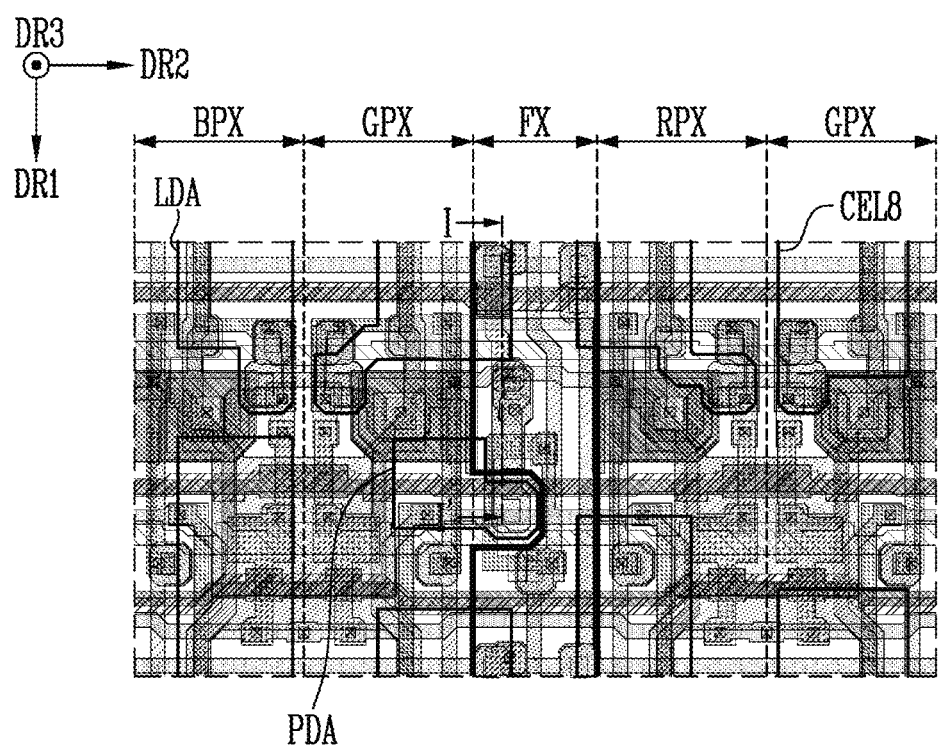
Figure 17:
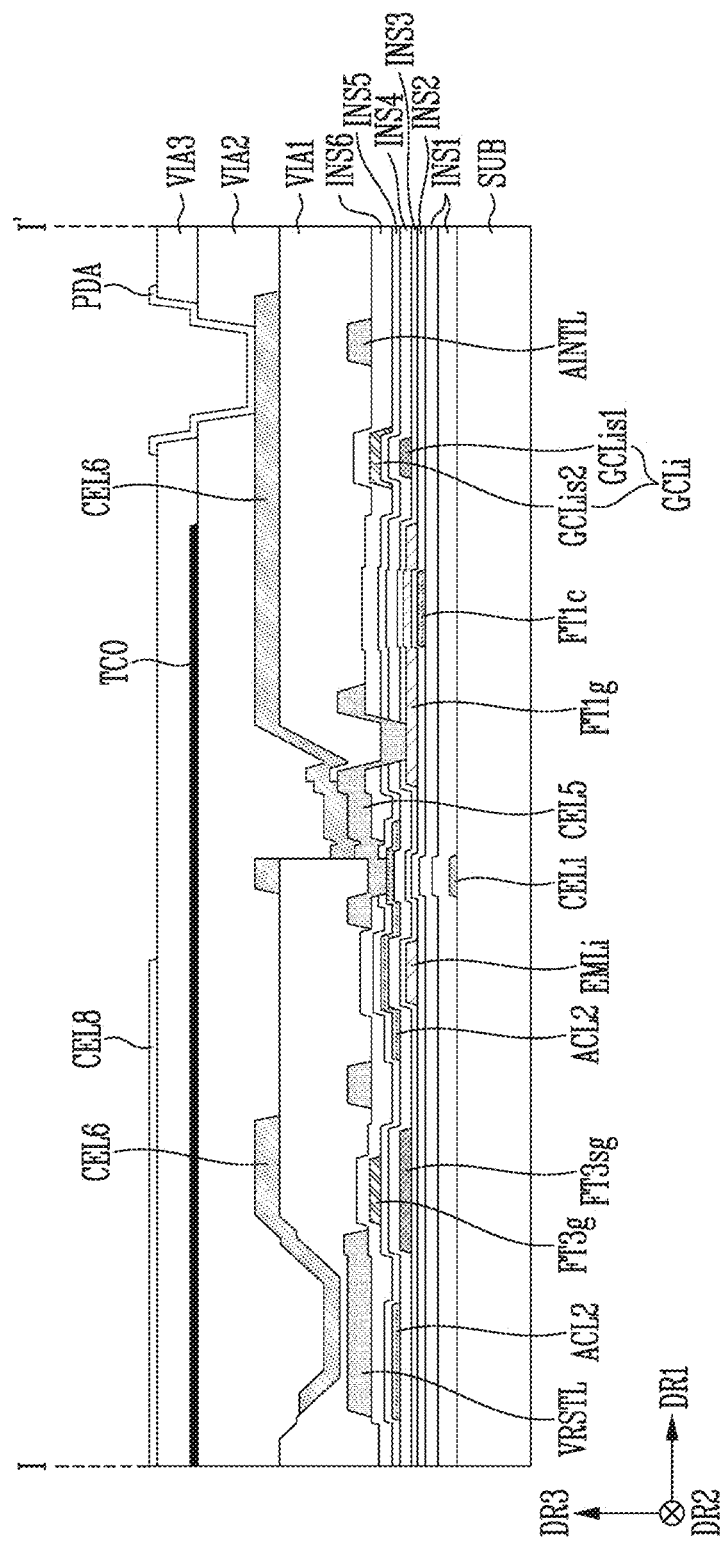

Referring to FIG. 16, there are illustrated patterns of the eighth electrode layer CEL8 according to some embodiments. Some patterns of the eighth electrode layer CEL8 may include the anode electrode LDA of the light emitting element LD and the anode electrode PDA of the light receiving element PD.

Figure 18:
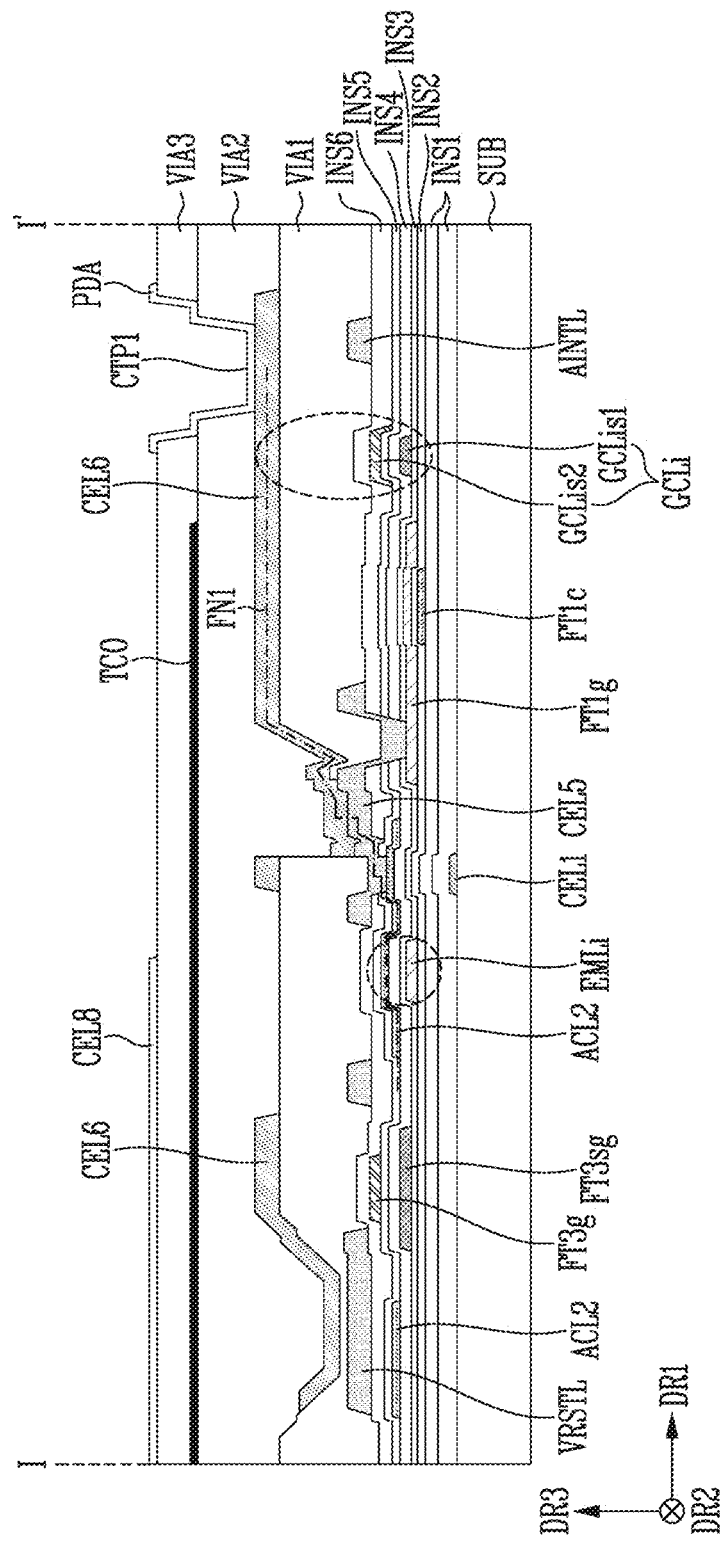
FIG. 18 is a diagram for describing parasitic capacitance between the pixel and the light sensor according to some embodiments of the present disclosure.

FIG. 18 is a diagram for describing parasitic capacitance between the pixel and the light sensor.

Referring to FIG. 18, the first node FN1 that is a sensing node of the light sensor FX may be formed in a relatively wide range from a first contact point CTP1 to the eighth electrode layer CEL8, the sixth electrode layer CEL6, the fifth electrode layer CEL5, and the second semiconductor layer ACL2. Here, the first contact point CTP1 may refer to a contact point between the anode electrode PAD of the light receiving element PD and the sensor circuit FXC (refer to FIG. 2).

Therefore, the first node FN1 may form parasitic capacitance with other electrodes, and the voltage of the first node FN1 may be affected by variation in voltages of other electrodes. For example, the emission line EMLi and the second scan line GCLi that overlap the first node FN1 cause variation in voltage during a light receiving period EIT, the voltage of the first node FN1 may be inaccurately changed (refer to FIG. 4). Accordingly, inaccurate sensing current may flow along the readout line ROLf.

Figure 19:
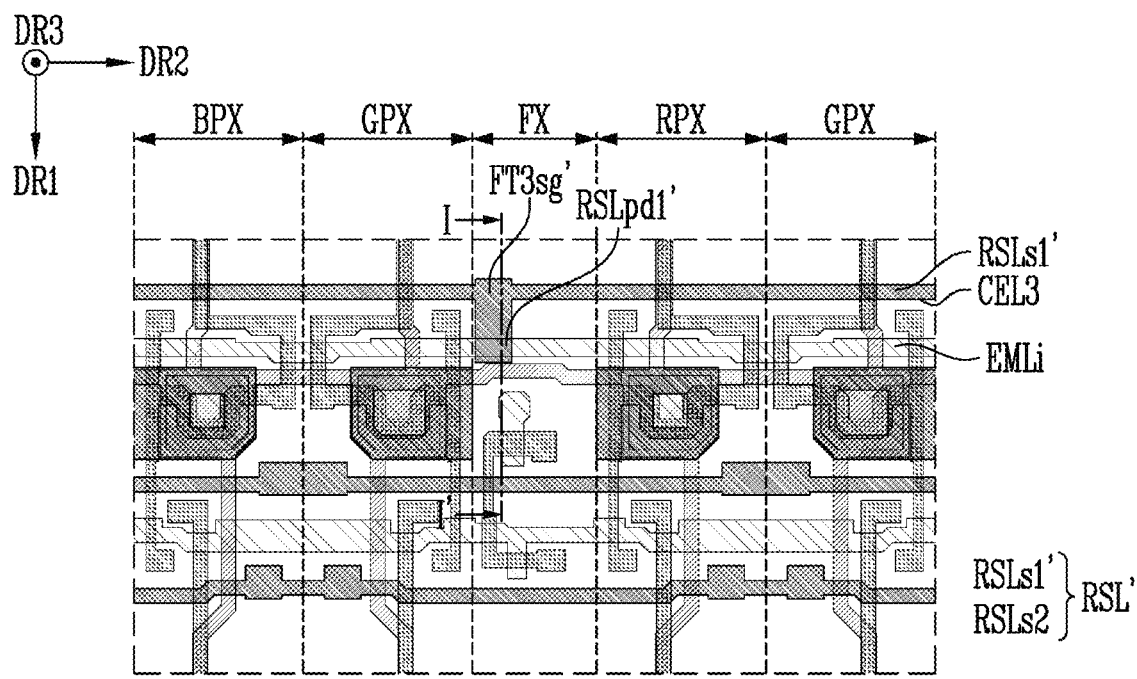
FIGS. 19 to 21 are diagrams for describing a parasitic capacitance removal structure according to some embodiments of the present disclosure.
Figure 20:
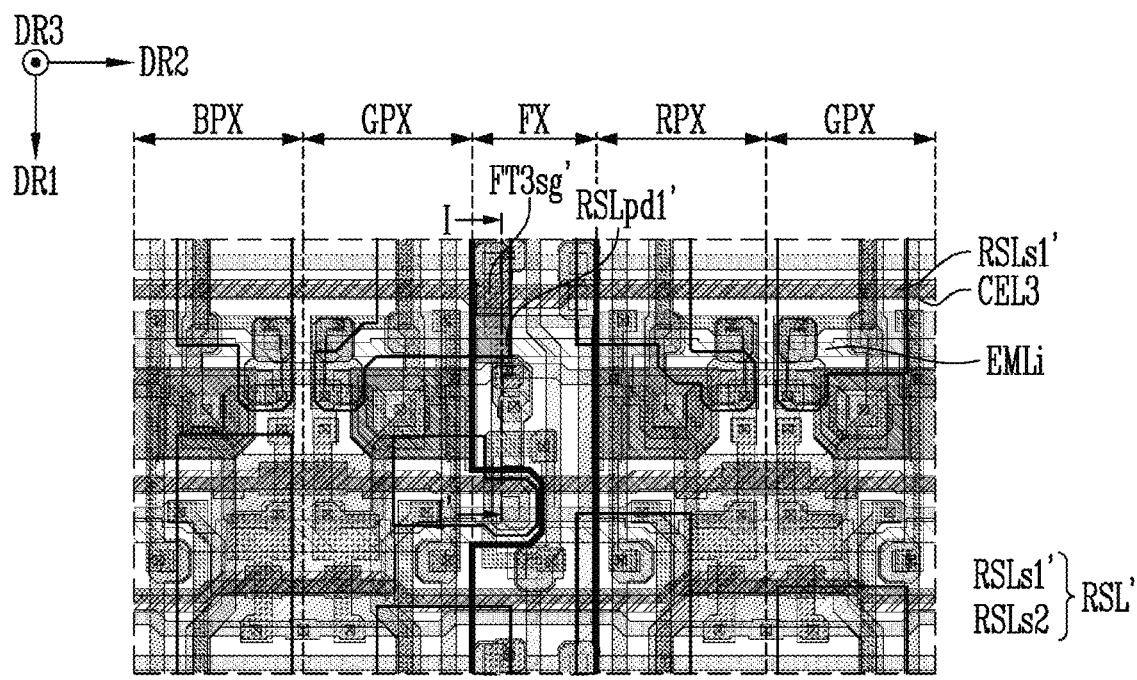
Figure 21:
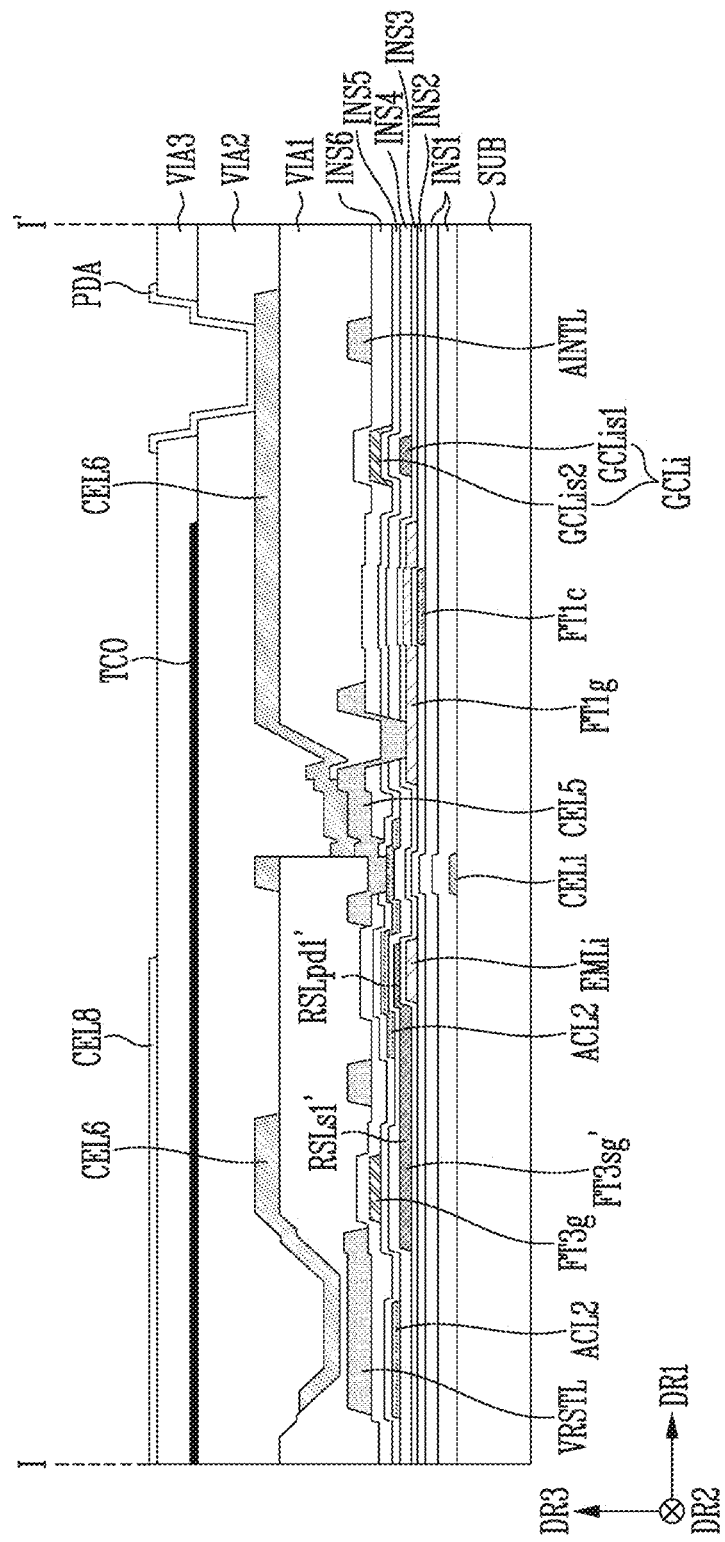
Figure 22:
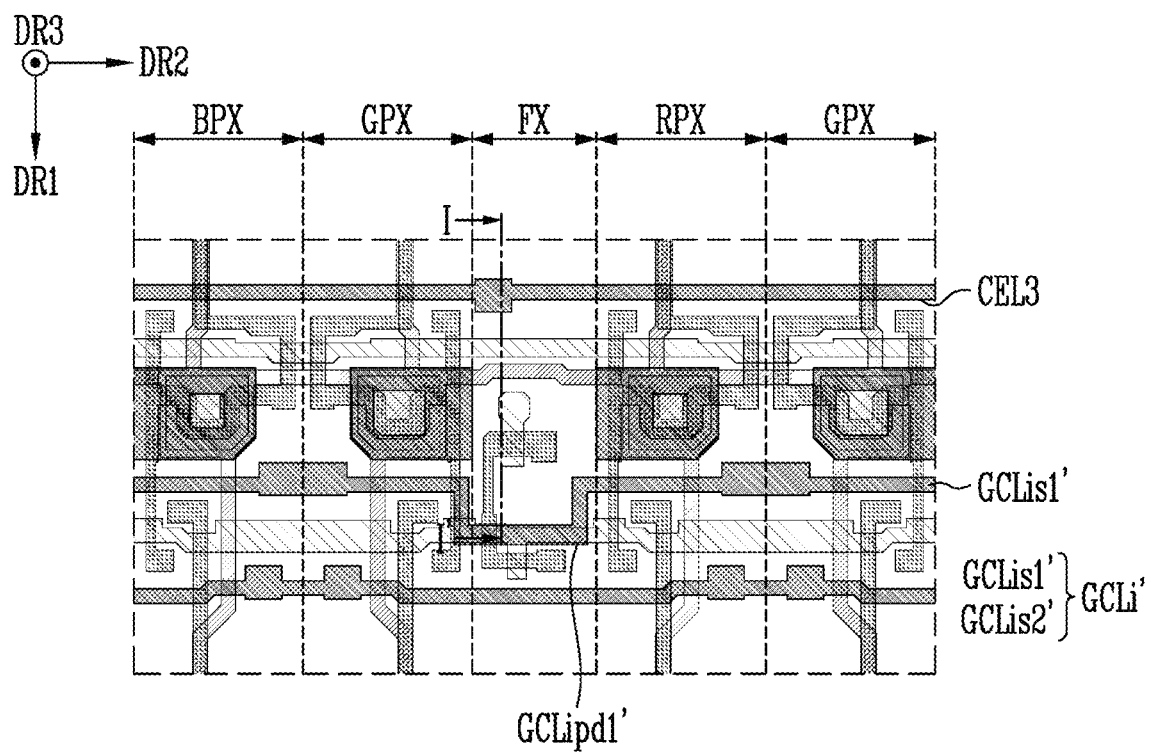
FIGS. 22 to 25 are diagrams for describing a parasitic capacitance removal structure according to some embodiments of the present disclosure.
Figure 23:
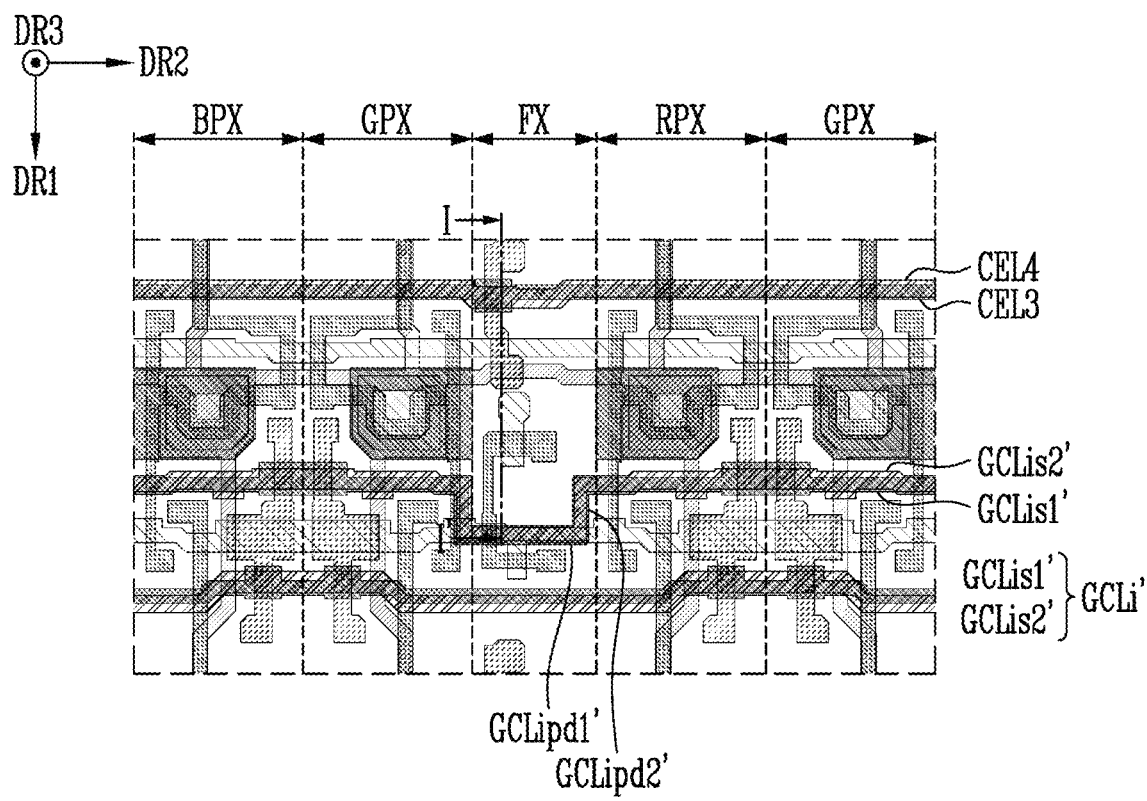
Figure 24:
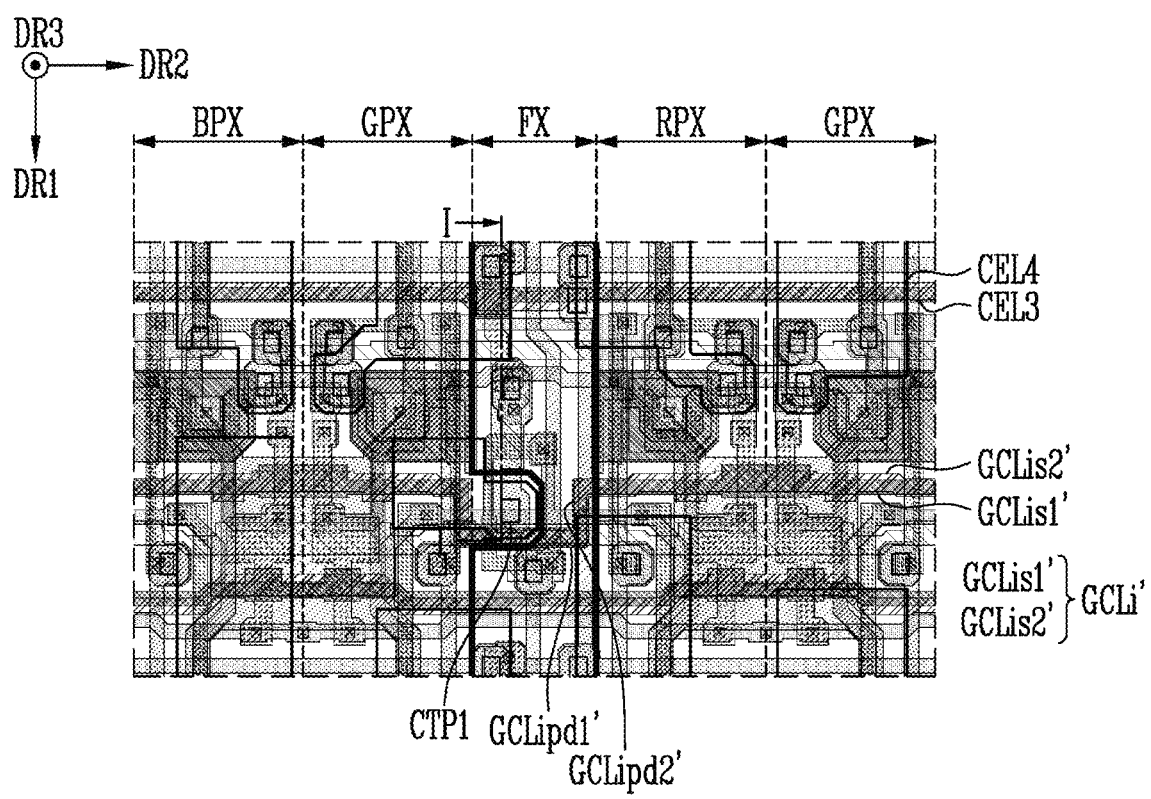

FIGS. 19 to 21 are diagrams for describing a parasitic capacitance removal structure according to some embodiments of the present disclosure.

Referring to FIG. 19, compared to FIG. 10, there is a difference in that at least a portion RSLpd1' of a reset line RSL' overlaps at least a portion of the emission line EMLi in a plan view. Referring to FIG. 20, compared to FIG. 16, there is a difference in that at least the portion RSLpd1' of the reset line RSL' overlaps at least a portion of the emission line EMLi in a plan view. FIG. 21 is a sectional view taken along line I-I' of FIG. 20.

The reset line RSL' may include a first sub-reset line RSLs1' and a second sub-reset line RSLs2 that are respectively positioned in two different electrode layers. At least the portion RSLpd1' of the first sub-reset line RSLs1' may overlap at least a portion of the emission line EMLi in a plan view.

The second sub-reset line RSLs2 may be spaced apart from at least a portion of the emission line EMLi, in a plan view. In other words, the second sub-reset line RSLs2 may not overlap at least a portion of the emission line EMLi, in a plan view. For example, the shape of the second sub-reset line RSLs2 may be the same as that of the case of FIG. 12.

The emission line EMLi may be positioned in the first direction DR1 from the reset line RSL'. The emission line EMLi and the reset line RSL' may extend in the second direction DR2 to be parallel to each other. At least the portion RSLpd1' of the reset line RSL' may protrude from the reset line RSL' in the first direction DR1. For example, at least the portion RSLpd1' of the reset line RSL' may have a shape in which the sub-gate electrode FT3sg' of the third sensor transistor FT3 extends in the first direction DR1.

The third electrode layer CEL3 in which the first sub-reset line RSLs1' is positioned may be located between the second semiconductor layer ACL2 and the second electrode layer CEL2 in which the emission line EMLi is positioned. At least a portion of the first sub-reset line RSLs1' may overlap at least a portion of the second semiconductor layer ACL2, in a plan view. Therefore, parasitic capacitance between the emission line EMLi and the first node FN1 may be electrically blocked by the first sub-reset line RSLs1' and thus removed.

FIGS. 22 to 25 are diagrams for describing a parasitic capacitance removal structure according to some embodiments of the present disclosure.

Figure 25:
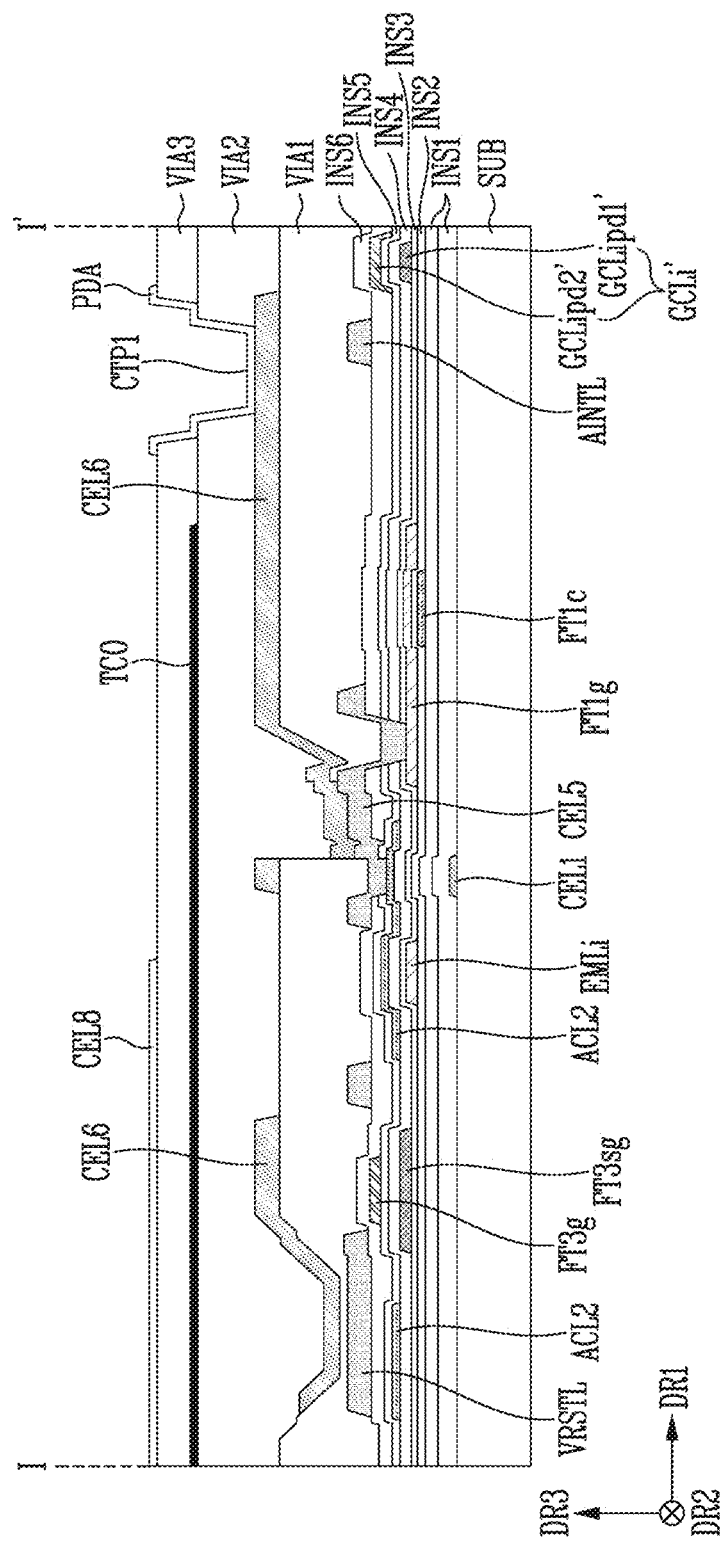
Figure 26:
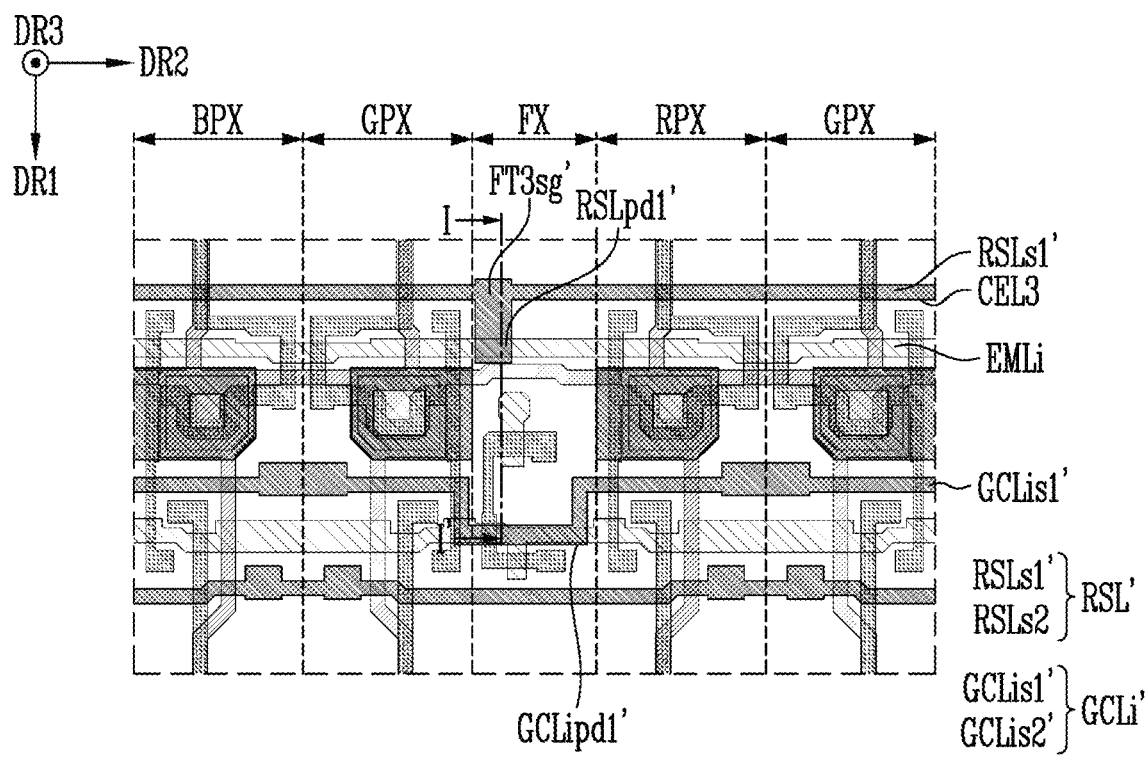
FIGS. 26 to 29 are diagrams for describing a parasitic capacitance removal structure according to some embodiments of the present disclosure.
Figure 27:
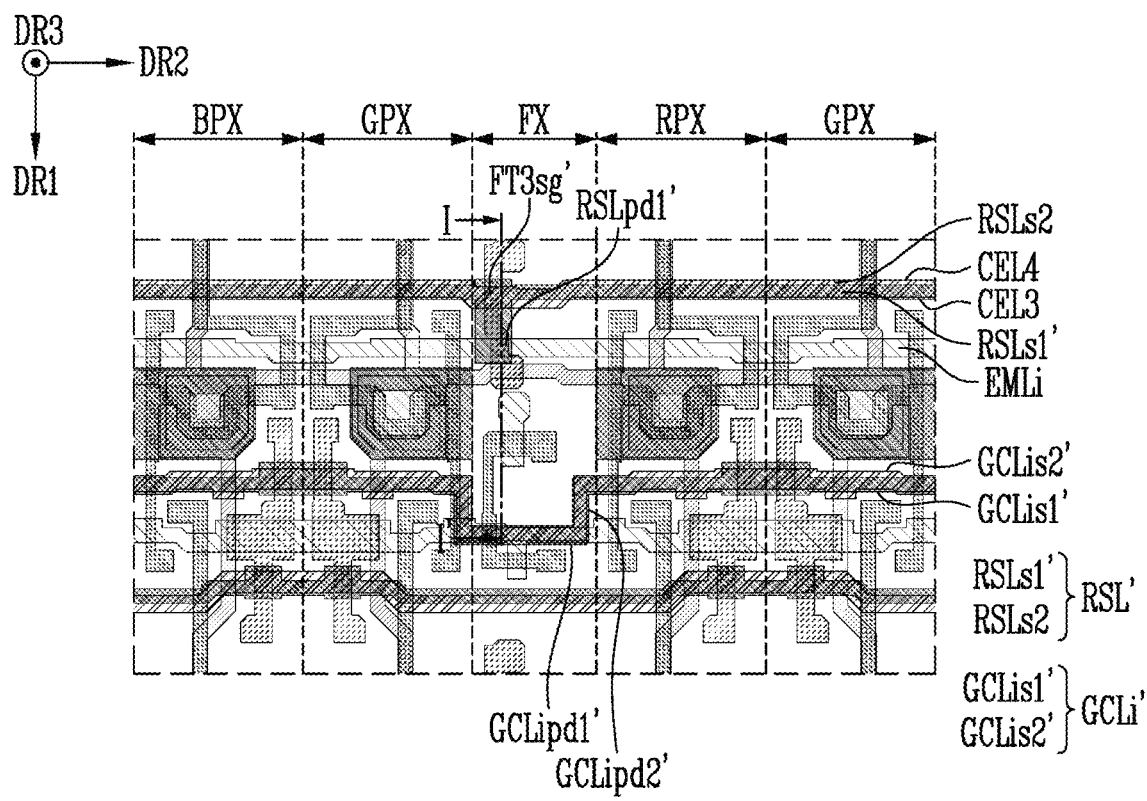
Figure 28:
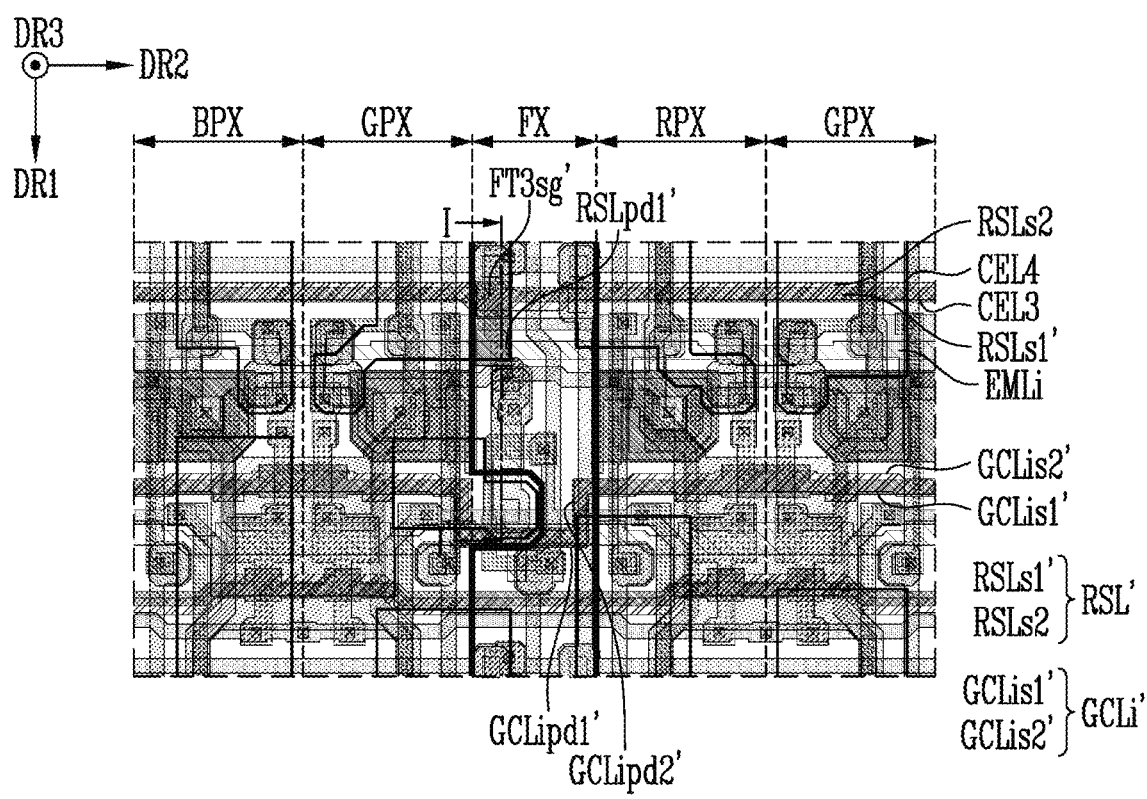
Figure 29:
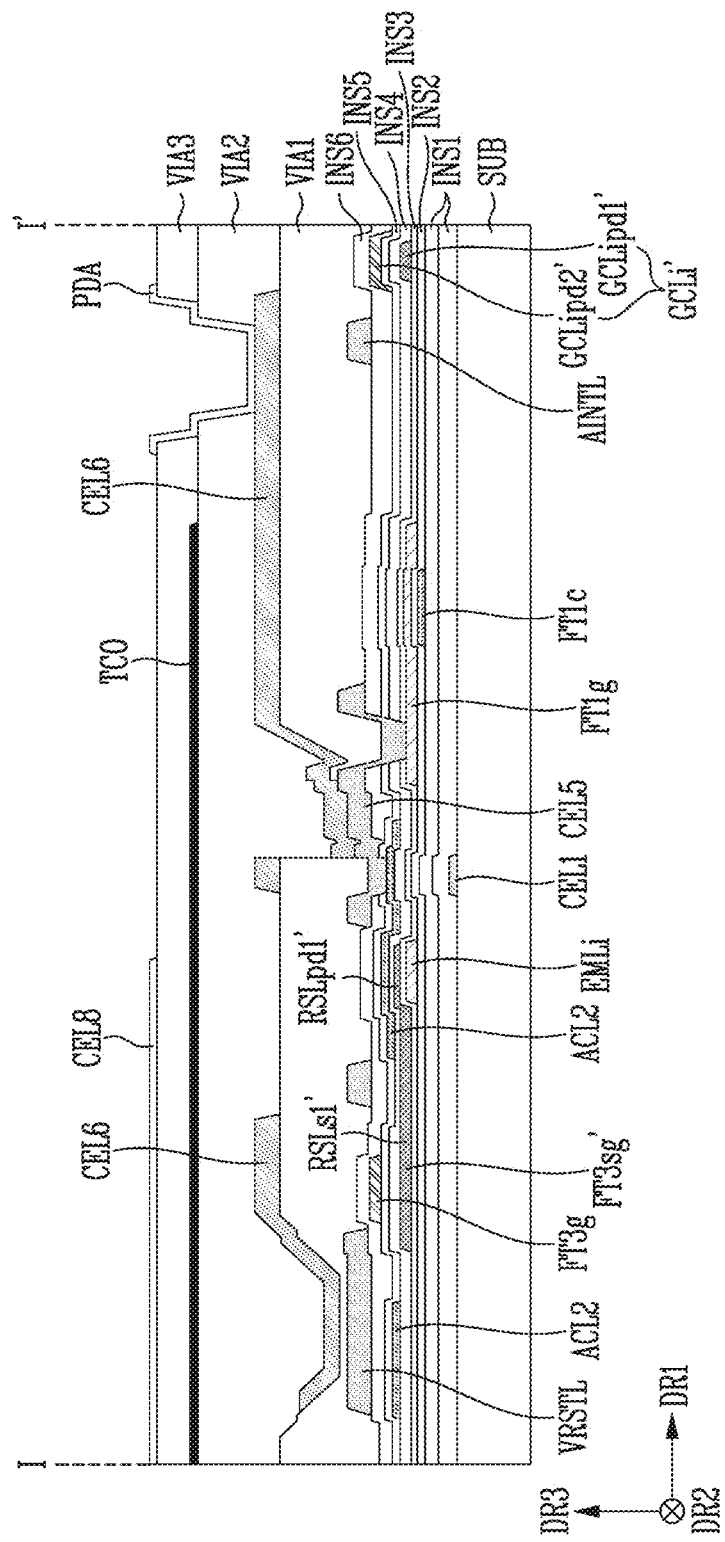

Referring to FIGS. 22 to 25, there is a difference from each of FIGS. 10, 12, 16, and 17 in that the second scan line GCLi' is spaced apart from the first contact point CTP1, in a plan view. FIG. 25 is a sectional view taken along line I-I' of FIG. 24. As described above, the first contact point CTP1 may refer to a contact point between the anode electrode PAD of the light receiving element PD and the sensor circuit FXC.

The second scan line GCLi' may include a portion protruding in the first direction DR1 to bypass the first contact point CTP1. The protruding portion may not overlap the first contact point CTP1 in a plan view.

The second scan line GCLi' may include a 2-1-th sub-scan line GCLis1' and a 2-2-th sub-scan line GCLis2' that are respectively positioned in two different electrode layers CEL3 and CEL4. The 2-1-th sub-scan line GCLis1' and the 2-2-th sub-scan line GCLis2' may respectively include portions GCLipd1' and GCLipd2' protruding in the first direction DR1 to bypass the first contact point CTP1.

For example, the protruding portions GCLipd1' and GCLipd2' of the 2-1-th sub-scan line GCLis1' and the 2-2-th sub-scan line GCLis2' may be positioned in the first direction DR1 from the second initialization voltage line AINTL. The other portions of the 2-1-th sub-scan line GCLis1' and the 2-2-th sub-scan line GCLis2' may be positioned in a direction opposite to the first direction DR1 from the second initialization voltage line AINTL.

According to some embodiments, the second scan line GCLi' and the first contact point CTP1 do not overlap each other in a plan view, so that parasitic capacitance between the second scan line GCLi' and the first node FN1 may be removed or mitigated.

FIGS. 26 to 29 are diagrams for describing a parasitic capacitance removal structure according to some embodiments of the present disclosure.

The embodiments illustrated with respect to FIGS. 26 to 29 are a combination of the embodiments illustrated with respect to FIGS. 19 to 21 and the embodiments illustrated with respect to FIGS. 22 to 25. Therefore, some redundant explanations of the same or similar components may be omitted.

Figure 30:
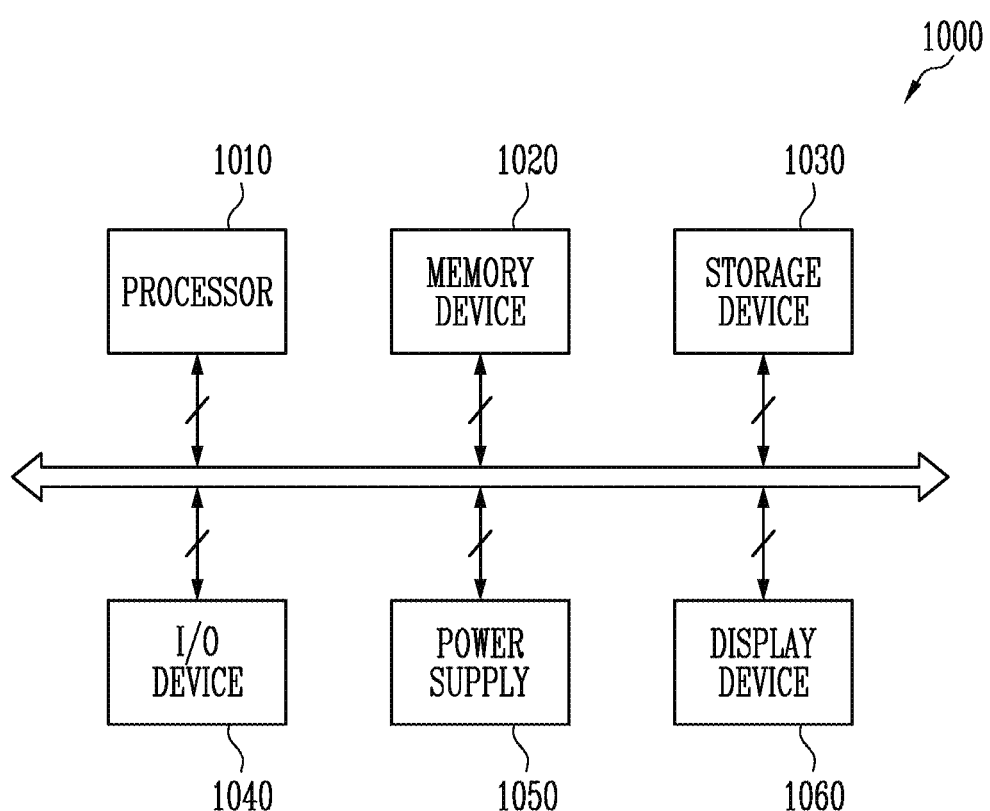
FIG. 30 is a block diagram illustrating an electronic device according to some embodiments of the present disclosure.
Figure 31:
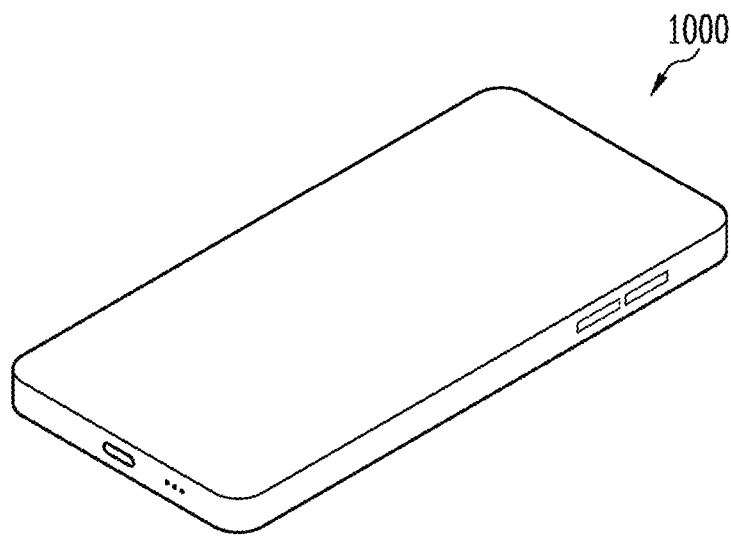
FIG. 31 is a diagram illustrating an example where the electronic device of FIG. 30 is implemented as a smartphone according to some embodiments of the present disclosure.
Figure 32:
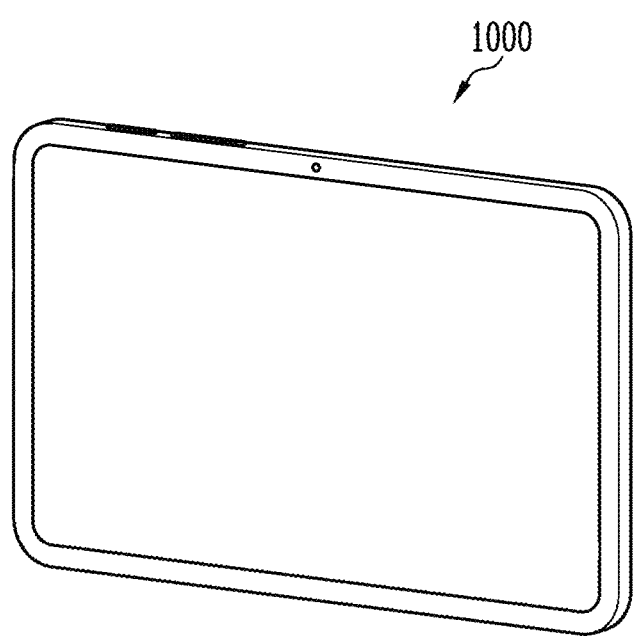
FIG. 32 is a diagram illustrating an example where the electronic device of FIG. 30 is implemented as a tablet PC according to some embodiments of the present disclosure.

FIG. 30 is a block diagram illustrating an electronic device 1000 in accordance with embodiments of the present disclosure. FIG. 31 is a diagram illustrating an example where the electronic device 1000 of FIG. 30 is implemented as a smartphone. FIG. 32 is a diagram illustrating an example where the electronic device 1000 of FIG. 30 is implemented as a tablet PC.

Referring to FIGS. 30 to 32, the electronic device 1000 may include a processor 1010, a memory device 1020, a storage device 1030, an input/output (I/O) device 1040, a power supply 1050, and a display device 1060. The display device 1060 may be the display device of FIG. 1. The electronic device 1000 may further include various ports for communication with a video card, a sound card, a memory card, a USB device, or other systems. According to some embodiments, as illustrated in FIG. 31, the electronic device 1000 may be implemented as a smartphone. According to some embodiments, as illustrated in FIG. 32, the electronic device 1000 may be implemented as a tablet PC. However, the aforementioned examples are illustrative, and the electronic device 1000 is not limited to the aforementioned examples. For example, the electronic device 1000 may be implemented as a cellular phone, a video phone, a smartpad, a smartwatch, a navigation device for vehicles, a computer monitor, a laptop computer, a head-mounted display device, or the like.

The processor 1010 may perform specific calculations or tasks. According to some embodiments, the processor 1010 may be a micro-processor, a central processing unit, an application processor, or the like. The processor 1010 may be connected to other components through an address bus, a control bus, a data bus, and the like. According to some embodiments, the processor 1010 may be connected to an expansion bus such as a peripheral component interconnect (PCI) bus. The processor 1010 may provide input image data to the display device 1060.

The memory device 1020 may store data needed to perform the operation of the electronic device 1000. For example, the memory device 1020 may include non-volatile memory devices such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, and a ferroelectric random access memory (FRAM) device, and/or volatile memory devices such as a dynamic random access memory (DRAM) device, a static random access memory (SRAM) device, a mobile DRAM device, and so on.

The storage device 1030 may include a solid state drive (SSD), a hard disk drive (HDD), a CD-ROM, or the like.

The I/O device 1040 may include input devices such as a keyboard, a keypad, a touchpad, a touch screen, and a mouse, and output devices such as a speaker and a printer. According to some embodiments, the display device 1060 may be included in the I/O device 1040.

The power supply 1050 may supply power needed to perform the operation of the electronic device 1000. The power supply 1050 may supply power to the display device 1060. For example, the power supply 1050 may be a power management integrated circuit (PMIC).

The display device 1060 may display images corresponding to visual information of the electronic device 1000. The display device 1060 may display an image based on the input image data. Here, the display device 1060 may be an organic light emitting display device or a quantum dot light emitting display device, but is not limited thereto. The display device 1060 may be connected to other components through the buses or other communication links.

In a display device and an electronic device including the display device according to some embodiments of the present disclosure, parasitic capacitance between a pixel and a light sensor can be removed.

Although aspects of some embodiments of the present disclosure have been disclosed for illustrative purposes, those skilled in the art will appreciate that various modifications, additions and substitutions are possible, without departing from the scope and spirit of the present disclosure as disclosed in the accompanying claims. Accordingly, the bounds and scope of embodiments according to the present disclosure should be determined by the technical spirit of the following claims, and their equivalents.

What is claimed is:

1. A display device, comprising:
   an emission line;
   a pixel configured to emit light in response to an emission signal received from the emission line;
   a reset line; and
   a light sensor configured to reset a voltage of a sensing node in response to a reset signal received from the reset line,
   wherein at least a portion of the reset line overlaps at least a portion of the emission line in a plan view.

2. The display device according to claim 1, further comprising a semiconductor layer,
   wherein an electrode layer in which the reset line is positioned is between the semiconductor layer and an electrode layer in which the emission line is positioned, and
   wherein at least a portion of the reset line overlaps at least a portion of the semiconductor layer in a plan view.

3. The display device according to claim 2, wherein the semiconductor layer is formed of an oxide semiconductor.

4. The display device according to claim 2, wherein the semiconductor layer corresponds to the sensing node.

5. The display device according to claim 1,
   wherein the reset line includes a first sub-reset line and a second sub-reset line that are respectively positioned in two different electrode layers,
   wherein at least a portion of the first sub-reset line overlaps at least a portion of the emission line in a plan view, and
   wherein the second sub-reset line is spaced apart from at least a portion of the emission line in a plan view.

6. The display device according to claim 5, further comprising a semiconductor layer,
   wherein an electrode layer in which the first sub-reset line is positioned is between the semiconductor layer and an electrode layer in which the emission line is positioned, and
   wherein at least a portion of the first sub-reset line overlaps at least a portion of the semiconductor layer in a plan view.

7. The display device according to claim 1,
   wherein the emission line is positioned in a first direction from the reset line,
   wherein the emission line and the reset line extend in a second direction to be parallel to each other, and
   wherein at least a portion of the reset line protrudes from the reset line in the first direction.

8. The display device according to claim 1, further comprising a scan line connected to the pixel,
   wherein the light sensor comprises a light receiving element, and a sensor circuit contacting an anode electrode of the light receiving element at a first contact point, and
   wherein the scan line is spaced apart from the first contact point, in a plan view.

9. The display device according to claim 8,
   wherein the scan line is spaced apart from the emission line in a first direction,
   wherein the scan line and the emission line extend in a second direction to be parallel to each other, and
   wherein the scan line includes a portion protruding in the first direction to bypass the first contact point.

10. The display device according to claim 9,
    wherein the scan line includes a first sub-scan line and a second sub-scan line that are respectively positioned in two different electrode layers, and
    wherein the first sub-scan line and the second sub-scan line respectively include portions protruding in the first direction to bypass the first contact point.

11. A display device, comprising:
    a scan line;
    a pixel connected to the scan line; and
    a light sensor including a light receiving element, and a sensor circuit contacting an anode electrode of the light receiving element at a first contact point,
    wherein the scan line is spaced apart from the first contact point, in a plan view.

12. The display device according to claim 11,
    wherein the scan line includes a portion protruding in a first direction to bypass the first contact point, and
    wherein the scan line extends in a second direction.

13. The display device according to claim 12,
    wherein the scan line includes a first sub-scan line and a second sub-scan line that are respectively positioned in two different electrode layers, and
    wherein the first sub-scan line and the second sub-scan line respectively include portions protruding in the first direction to bypass the first contact point.

14. The display device according to claim 11, further comprising an emission line and a reset line,
    wherein the pixel is configured to emit light in response to an emission signal received from the emission line,
    wherein the light sensor is configured to reset a voltage of a sensing node in response to a reset signal received from the reset line, and
    wherein at least a portion of the reset line overlaps at least a portion of the emission line in a plan view.

15. The display device according to claim 14, further comprising a semiconductor layer,
    wherein an electrode layer in which the reset line is positioned is between the semiconductor layer and an electrode layer in which the emission line is positioned, and
    wherein at least a portion of the reset line overlaps at least a portion of the semiconductor layer in a plan view.

16. The display device according to claim 15, wherein the semiconductor layer is formed of an oxide semiconductor.

17. The display device according to claim 15, wherein the semiconductor layer corresponds to the sensing node.

18. The display device according to claim 14,
wherein the reset line includes a first sub-reset line and a second sub-reset line that are respectively positioned in two different electrode layers,
wherein at least a portion of the first sub-reset line overlaps at least a portion of the emission line in a plan view, and
wherein the second sub-reset line is spaced apart from at least a portion of the emission line in a plan view.

19. The display device according to claim 18, further comprising a semiconductor layer,
wherein an electrode layer in which the first sub-reset line is positioned is between the semiconductor layer and an electrode layer in which the emission line is positioned, and
wherein at least a portion of the first sub-reset line overlaps at least a portion of the semiconductor layer in a plan view.

20. An electronic device comprising:
a processor configured to provide input image data to a display device;
the display device configured to display an image based on the input image data; and
a power supply configured to supply power to the display device,
wherein the display device comprises:
an emission line;
a pixel configured to emit light in response to an emission signal received from the emission line;
a reset line; and
a light sensor configured to reset a voltage of a sensing node in response to a reset signal received from the reset line, and
wherein at least a portion of the reset line overlaps at least a portion of the emission line in a plan view.

\* \* \* \* \*